United States Patent
Chen et al.

(10) Patent No.: US 9,480,182 B2
(45) Date of Patent: Oct. 25, 2016

(54) CABLE MANAGEMENT ARM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chi-Chih Chou, Kaohsiung (TW); Chi-Wei Wu, Kaohsiung (TW); Chun-Chiang Wang, Kaohsiung (TW)

(73) Assignees: King Slide Works Co., Ltd., Kaohsiung (TW); King Slide Technology Co., Ltd., Kaihsiung (TW)

( * ) Notice: Subject to any disclaimer, the term of this patent is extended or adjusted under 35 U.S.C. 154(b) by 165 days.

(21) Appl. No.: 14/585,463

(22) Filed: Dec. 30, 2014

(65) Prior Publication Data
US 2016/0186895 A1    Jun. 30, 2016

(51) Int. Cl.
| | |
|---|---|
| *F16L 3/015* | (2006.01) |
| *H05K 7/14* | (2006.01) |
| *H02B 1/36* | (2006.01) |
| *H02B 1/01* | (2006.01) |
| *H05K 7/18* | (2006.01) |
| *H02G 3/04* | (2006.01) |

(52) U.S. Cl.
CPC ............ *H05K 7/1491* (2013.01); *F16L 3/015* (2013.01); *H02B 1/012* (2013.01); *H02B 1/36* (2013.01); *H05K 7/1489* (2013.01); *H05K 7/186* (2013.01); *H02G 3/04* (2013.01); *H05K 7/1421* (2013.01)

(58) Field of Classification Search
CPC .................................................... H05K 7/1491
See application file for complete search history.

(56) References Cited

U.S. PATENT DOCUMENTS

| | | | | | |
|---|---|---|---|---|---|
| 4,614,383 | A | * | 9/1986 | Polley | H02B 1/202 174/69 |
| 6,070,742 | A | * | 6/2000 | McAnally | H05K 7/1491 211/26 |
| 6,327,139 | B1 | * | 12/2001 | Champion | H02B 1/202 174/69 |

(Continued)

FOREIGN PATENT DOCUMENTS

| | | | | |
|---|---|---|---|---|
| DE | 102006055637 A1 * | 6/2008 | ............... | H02G 3/34 |
| JP | EP 2106007 A1 * | 9/2009 | ........... | H02G 11/006 |

(Continued)

*Primary Examiner* — Joshua J Michener
*Assistant Examiner* — Chiedu Chibogu
(74) *Attorney, Agent, or Firm* — Rosenberg, Klein & Lee

(57) ABSTRACT

A cable management arm (CMA) for arranging cables extending from at least two areas of an electronic equipment chassis includes first and second cable management mechanisms and first and second supporting mechanisms. The first cable management mechanism serves to arrange cables extending from one of the chassis areas and includes a supporting bracket. The first supporting mechanism serves to support the first cable management mechanism and includes a fastener. The second cable management mechanism serves to arrange cables extending from the other chassis area and includes a supporting bracket releasably mounted to the fastener of the first supporting mechanism. The second supporting mechanism serves to support the second cable management mechanism and includes a fastener releasably mounted to the supporting bracket of the first cable management mechanism.

18 Claims, 22 Drawing Sheets

(56) References Cited

U.S. PATENT DOCUMENTS

| | | | | |
|---|---|---|---|---|
| 6,805,248 B2* | 10/2004 | Champion | ............ | H05K 7/1491 211/26 |
| 7,203,000 B2* | 4/2007 | Kotera | ................... | F16M 11/38 160/84.06 |
| 7,473,846 B2* | 1/2009 | Doerr | ................... | H05K 7/1491 174/68.3 |
| 7,480,154 B2* | 1/2009 | Lawrence | ............ | H05K 7/1491 174/72 A |
| 7,554,819 B2 | 6/2009 | Chen et al. | | |
| 7,746,667 B1* | 6/2010 | Baiza | ................... | H05K 7/1491 361/756 |
| 7,952,883 B2* | 5/2011 | Hidaka | ................... | H05K 7/16 312/223.1 |
| 8,045,343 B2* | 10/2011 | Fan | ...................... | H05K 7/1491 361/810 |
| 2004/0120133 A1* | 6/2004 | Nguyen | ............... | H05K 7/1491 361/825 |
| 2009/0078834 A1* | 3/2009 | Chen | .................... | H01R 9/2416 248/70 |
| 2012/0012714 A1* | 1/2012 | Rubenstein | .......... | H02G 3/0456 248/68.1 |

FOREIGN PATENT DOCUMENTS

| | | | | | |
|---|---|---|---|---|---|
| TW | GB 2420964 A | * | 6/2006 | ................ | F16L 3/01 |
| TW | GB 2425245 A | * | 10/2006 | ........... | H02G 3/0456 |
| TW | GB 2450941 A | * | 1/2009 | ........... | H05K 7/1491 |

* cited by examiner

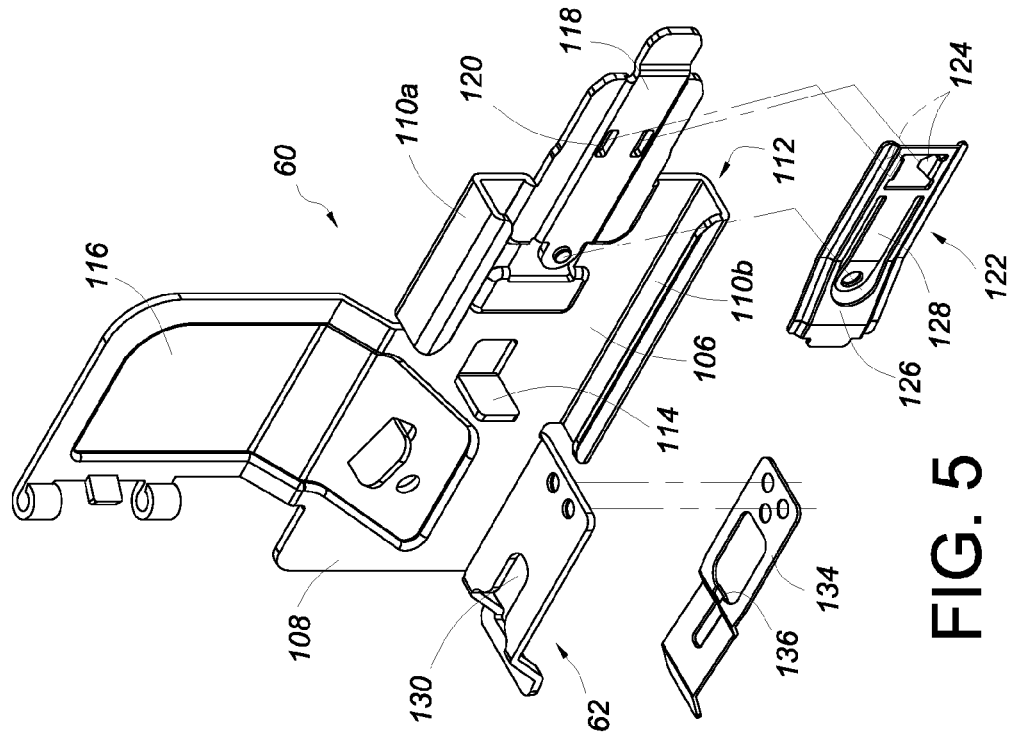

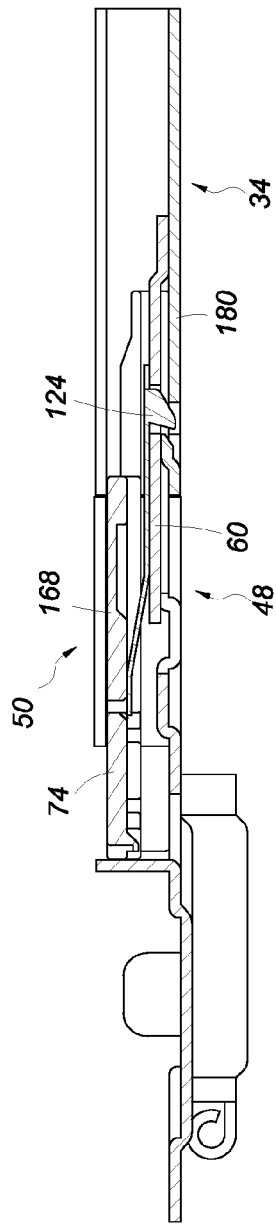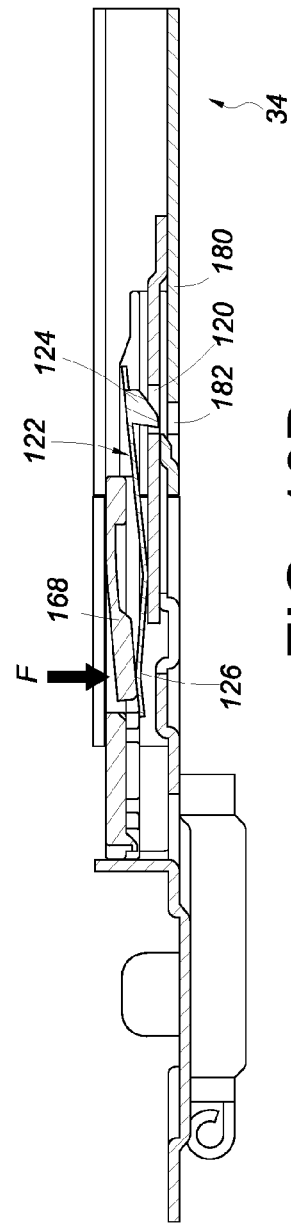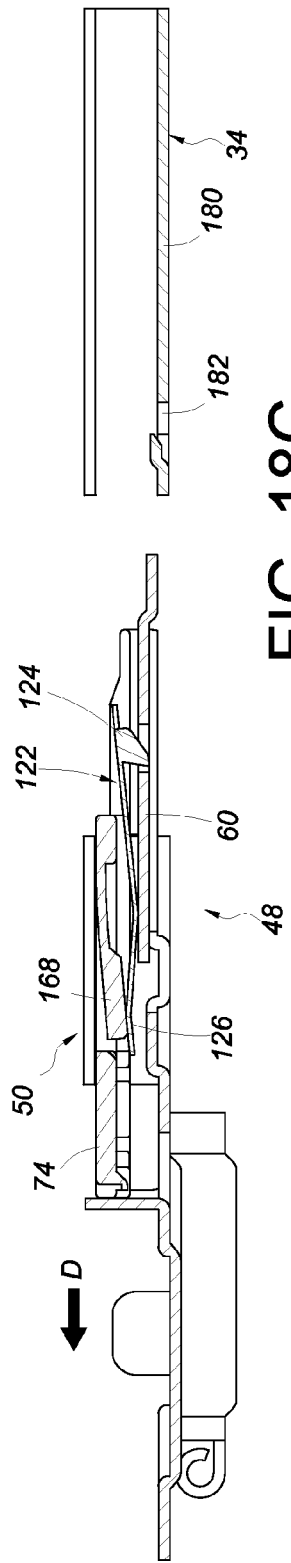
FIG. 18A
FIG. 18B
FIG. 18C

CABLE MANAGEMENT ARM

FIELD OF THE INVENTION

The present invention relates to a cable management arm. More particularly, the present invention relates to a cable management arm which is applicable not only to a server chassis, but also to at least two different areas of the chassis.

BACKGROUND OF THE INVENTION

With the rapid development of information technology and the telecommunication industry, demand for server systems is increasing. As is well known in the art, a server system includes a server for storing massive amounts of electronic information, and the chassis of the server typically has two opposite lateral sides respectively mounted to the posts of a rack via two slide rail assemblies and is designed to protect the electronic devices or parts of the server, wherein the electronic devices or parts generally have cables essential to normal operation of the server. It is common practice, therefore, to equip a server system with a cable management arm (CMA) for carrying such cables and thereby satisfying the need for cable management.

For instance, the specification of U.S. Pat. No. 7,554,819 B2 discloses a cable management arm applicable to a general server chassis. The cable management arm includes a frame (1), a support rail (2), two sliding members (3, 4), two connectors (5, 6), and an insertion socket (7). The frame (1) of the cable management arm includes front and rear arms (11, 12) for holding the cables of a server (e.g., with the cables passing through and placed in the cable holders (15) on each arm). The specification of the foregoing patent is incorporated herein by reference.

It is sometimes required, however, that the chassis of a large server have a two-tier structure and be divided into different working areas. In that case, cables in the upper tier of the chassis and those in the lower tier cannot be properly arranged without a specially designed cable management arm. It is therefore important to develop a cable management arm which can hold cables extending from different areas of a chassis and which can also be rapidly mounted and detached.

SUMMARY OF THE INVENTION

The present invention relates to a cable management arm which can be applied to at least two different areas of a server chassis.

According to one aspect of the present invention, a cable management arm is provided for use with a chassis which includes an upper-tier area and a lower-tier area and whose two opposite lateral sides are mounted to a rack via a first slide rail assembly and a second slide rail assembly respectively. Each of the slide rail assemblies includes a fixed rail and a movable rail longitudinally displaceable with respect to the fixed rail. The two opposite lateral sides of the chassis are mounted to the movable rails of the slide rail assemblies respectively. The cable management arm includes a first cable management mechanism, a first supporting mechanism, a second cable management mechanism, and a second supporting mechanism. The first cable management mechanism includes: a first arm member; a second arm member, movably connected to the first arm member, wherein the first arm member and the second arm member of the first cable management mechanism generally correspond in position to the upper-tier area of the chassis; a first connecting device movably connected to the first arm member, the first connecting device including a first connecting section, a second connecting section, and a passage at the first connecting section, the first connecting device being releasably mounted to the fixed rail of the first slide rail assembly; a supporting bracket connected to the second connecting section; and a second connecting device movably connected to the second arm member, the second connecting device being releasably mounted to the chassis. The first supporting mechanism includes: a first supporting rail for supporting one of the first arm member and the second arm member of the first cable management mechanism; a second supporting rail telescopically connected to the first supporting rail; a movable member connected to the first supporting rail, the movable member being movably mounted to the passage of the first connecting device of the first cable management mechanism; and a fastener connected to the second supporting rail. The second cable management mechanism includes: a first arm member; a second arm member movably connected to the first arm member, wherein the first arm member and the second arm member of the second cable management mechanism generally correspond in position to the lower-tier area of the chassis; a first connecting device movably connected to the first arm member, the first connecting device including an extension, the first connecting device being releasably mounted to the fixed rail of the second slide rail assembly; a supporting bracket connected to the extension, the supporting bracket being releasably connected to the fastener of the first supporting mechanism; and a second connecting device movably connected to the second arm member, the second connecting device being releasably mounted to the chassis. The second supporting mechanism includes: a first supporting rail for supporting one of the first arm member and the second arm member of the second cable management mechanism; a second supporting rail telescopically connected to the first supporting rail; a movable member connected to the first supporting rail, the movable member being movably mounted to the first connecting device of the second cable management mechanism; and a fastener connected to the second supporting rail, the fastener being releasably mounted to the supporting bracket of the first cable management mechanism.

One of the advantageous features of implementing the present invention is that the cable management arm can be applied to at least two different areas of a server chassis to arrange cables connected to or extending from the different areas of the chassis.

BRIEF DESCRIPTION OF THE DRAWINGS

The invention as well as a preferred mode of use and the advantages thereof will be best understood by referring to the following detailed description of some illustrative embodiments in conjunction with the accompanying drawings, in which:

FIG. 5 is an exploded view of the first connecting device and the supporting bracket of the first cable management mechanism of the cable management arm in an embodiment of the present invention;

FIG. 5A is a partial view of the first cable management mechanism in FIG. 5, showing in particular the supporting bracket of the first cable management mechanism;

FIG. 6 is a schematic exploded view of the second connecting device of the first cable management mechanism of the cable management arm in an embodiment of the present invention;

FIG. 18A shows how the first connecting device of a cable management mechanism of the cable management arm in an embodiment of the present invention is assembled to the fixed rail of a slide rail assembly;

FIG. 18B shows how the first connecting device in FIG. 18A is detached from the fixed rail of the slide rail assembly;

FIG. 18C further shows how the first connecting device in FIG. 18A is detached from the fixed rail of the slide rail assembly;

DETAILED DESCRIPTION OF THE INVENTION

Figure 1:
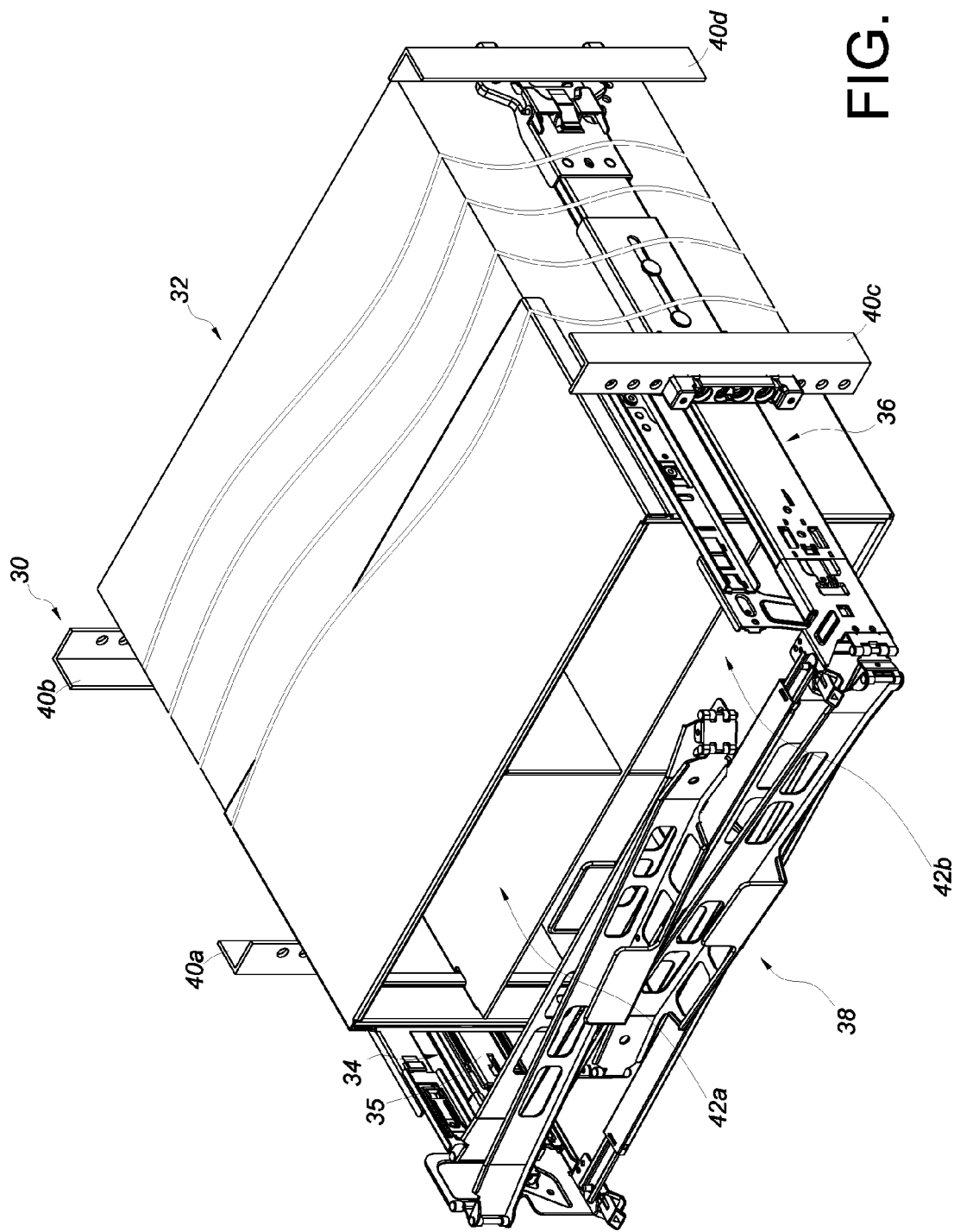
FIG. 1 schematically shows how the cable management arm in an embodiment of the present invention is applied to different areas of a chassis.

Referring to FIG. 1, an embodiment of the present invention includes a rack 30, a chassis 32, a first slide rail assembly 34, a second slide rail assembly 36, undo cable management arm 38. The rack 30 has a plurality of supporting posts 40a, 40b, 40c, and 40d. The chassis 32 includes an upper-tier area 42a and a lower-tier area 42b. The first slide rail assembly 34 is mounted to a lateral side of the chassis 32 and between the supporting posts 40a and 40b of the rack 30 (e.g., this lateral side of the chassis 32 being mounted to a movable rail 35 of the first slide rail assembly 34). The second slide rail assembly 36 is mounted to an other lateral side of the chassis 32 and between the supporting posts 40c and 40d of the rack 30 (e.g., this lateral side of the chassis 32 being mounted to a movable rail (not shown) of the second slide rail assembly 36). Thus, the chassis 32 can be easily pulled out of and pushed back into the rack 30 via the first and the second slide rail assemblies 34 and 36. The cable management arm 38 is connected between the first slide rail assembly 34 and the second slide rail assembly 36 and is configured for arranging cables connected to or extending from a rear side of the chassis 32.

Figure 2:
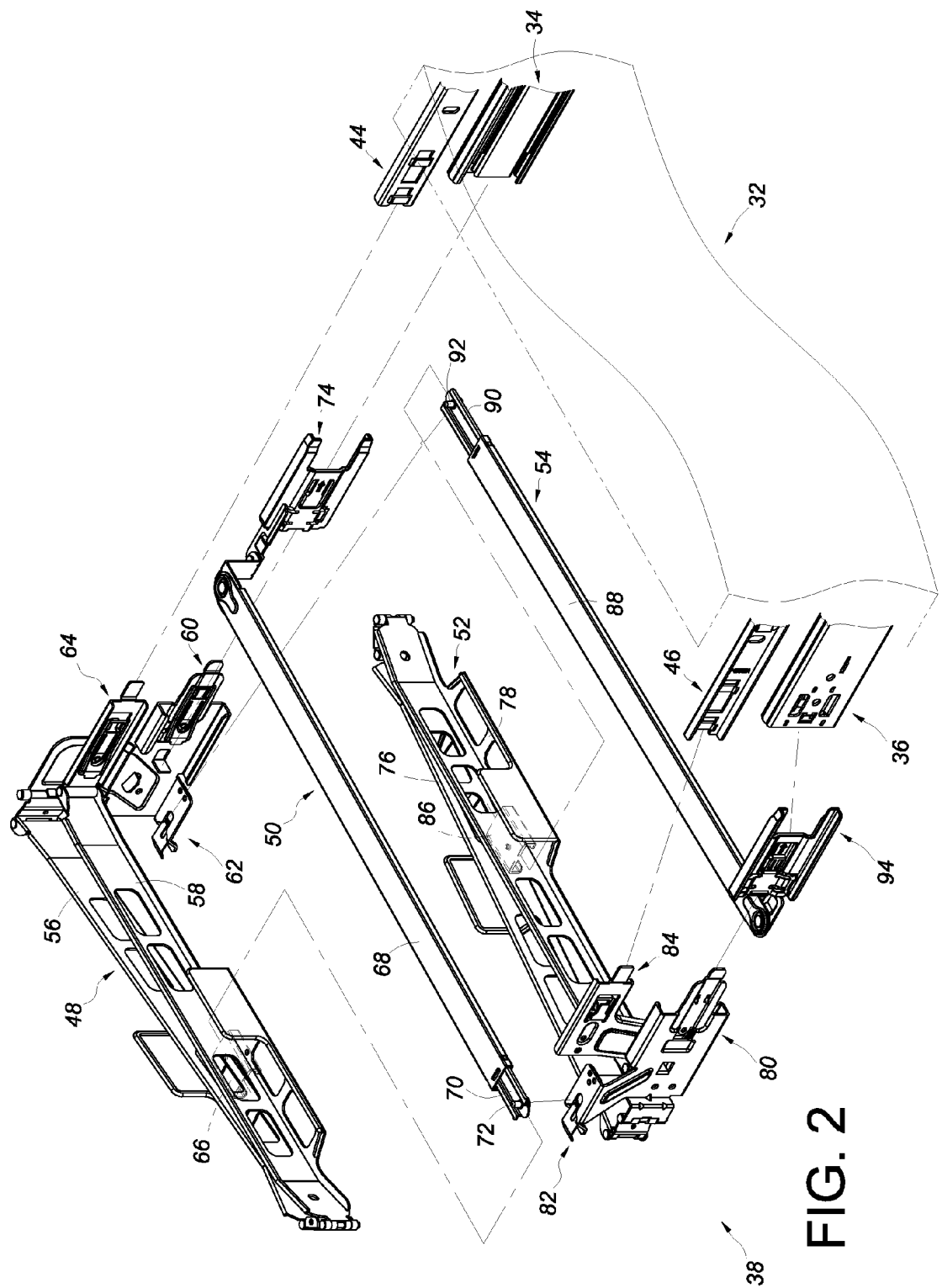
FIG. 2 is a schematic exploded view showing how the cable management arm in an embodiment of the present invention is applied to a chassis and two slide rail assemblies.

As shown in FIG. 2, a first connecting base 44 is fixedly mounted to the lateral side of the chassis 32 which is adjacent to the first slide rail assembly 34, and a second connecting base 46 is fixedly mounted to the opposite lateral side of the chassis 32 which is adjacent to the second slide rail assembly 36. The cable management arm 38 includes a first cable management mechanism 48, a first supporting mechanism 50, a second cable management mechanism 52, and a second supporting mechanism 54. The first cable management mechanism 48 includes a first arm member 56; a second arm member 58 connected to the first arm member 56; a first connecting device 60 and a supporting bracket 62, both connected to one end of the first arm member 56; a second connecting device 64 connected to the second arm member 58; and a slider 66 connected to an arm portion of the first arm member 56. The second connecting device 64 can be connected to the first connecting base 44. The first supporting mechanism 50 includes a first supporting rail 68, a second supporting rail 70 telescopically connected to the first supporting rail 68, a fastener 72 connected to the second supporting rail 70 (e.g., the fastener 72 being connected to the second supporting rail 70 at a position adjacent to an end portion thereof), and a movable member 74 connected to the first supporting rail 68. The slider 66 of the first cable management mechanism 48 is movably connected to, and can be displaced along, the first supporting rail 68 of the first supporting mechanism 50. The first supporting rail 68 of the first supporting mechanism 50 serves to support one of the first arm member 56 and the second arm member 58 of the first cable management mechanism 48 (e.g., the first arm member 56 of the first cable management mechanism 48). It is feasible to first connect the movable member 74 to the first connecting device 60 of the first cable management mechanism 48 and then connect them jointly to the first slide rail assembly 34. The second cable management mechanism 52 includes a first arm member 76; a second arm member 78 connected to the first arm member 76; a first connecting device 80 and a supporting bracket 82, both connected to one end of the first arm member 76; a second connecting device 84 connected to the second arm member 78; and a slider 86 connected to an arm portion of the first arm member 76. The second connecting device 84 can be connected to the second connecting base 46. The second supporting mechanism 54 includes a first supporting rail 88, a second supporting rail 90 telescopically connected to the first supporting rail 88, a fastener 92 connected to the second supporting rail 90 (e.g., the fastener 92 being connected to the second supporting rail 90 at a position adjacent to an end portion thereof), and a movable member 94 connected to the first supporting rail 88. The slider 86 of the second cable management mechanism 52 is movably connected to the first supporting rail 88 of the second supporting mechanism 54. The first supporting rail 88 of the second supporting mechanism 54 serves to support one of the first arm member 76 and the second arm member 78 of the second cable management mechanism 52 (e.g., the first arm member 76 of the second cable management mechanism 52). It is feasible to connect the movable member 94 to the first connecting device 80 of the second cable management mechanism 52 before connecting them jointly to the second slide rail assembly 36. The supporting bracket 82 of the second cable management mechanism 52 and the fastener 72 of the first supporting mechanism 50 are assembled together in a releasable manner, and so are the fastener 92 of the second supporting mechanism 54 and the supporting bracket 62 of the first cable management mechanism 48. Thus, the first cable management mechanism 48 and the first supporting mechanism 50 are releasably assembled with the second cable management mechanism 52 and the second supporting mechanism 54. In a preferred embodiment, the first cable management mechanism 48 and the second cable management mechanism 52 are of substantially the same structure; their difference consists generally in that the supporting bracket 62 of the first cable management mechanism 48 is adjacent to and below the first connecting device 60 of the first cable management mechanism 48 whereas the supporting bracket 82 of the second cable management mechanism 52 is adjacent to and above the first connecting device 80 of the second cable management mechanism 52. Apart from that, the first connecting device 60 of the first cable management mechanism 48 is connected to the movable member 74 of the first supporting mechanism 50 and then releasably mounted to the first slide rail assembly 34 in generally the same way as the first connecting device 80 of the second cable management mechanism 52 is connected to the movable member 94 of the second supporting mechanism 54 and then releasably mounted to the second slide rail assembly 36, the second connecting device 64 of the first cable management mechanism 48 is releasably mounted to the first connecting base 44 in generally the same way as the second connecting device 84 of the second cable management mechanism 52 is releasably mounted to the second connecting base 46, and the fastener 92 of the second supporting mechanism 54 is releasably mounted to the supporting bracket 62 of the first cable management mechanism 48 in generally the same way as the fastener 72 of the first supporting mechanism 50 is releasably mounted to the supporting bracket 82 of the second cable management mechanism 52.

Figure 3:
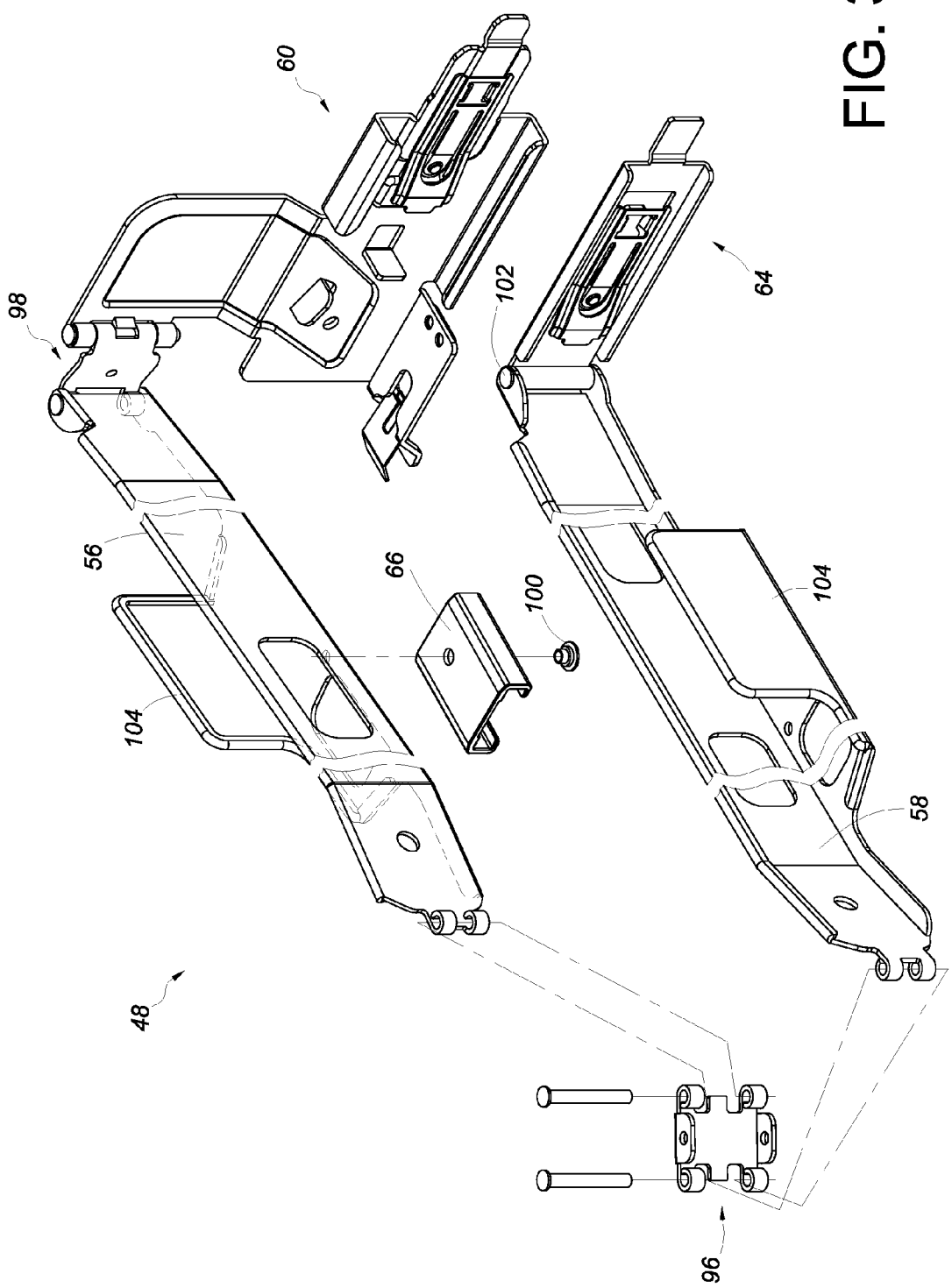
FIG. 3 is an exploded view of the arm members of the first cable management mechanism of the cable management arm in an embodiment of the present invention.
Figure 4:
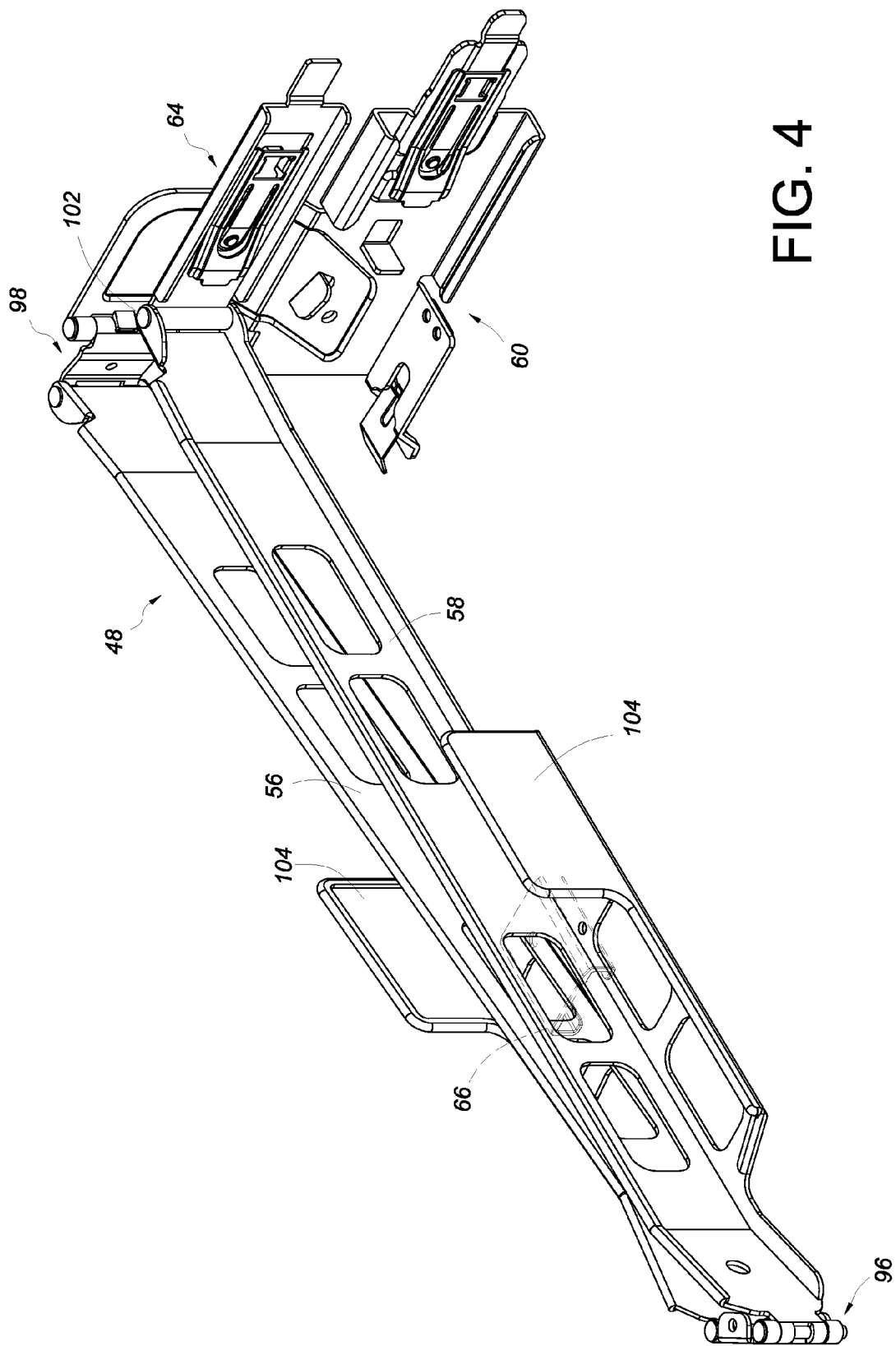
FIG. 4 is a perspective view of the first cable management mechanism of the cable management arm in an embodiment of the present invention.

FIG. 3 and FIG. 4 are an exploded view and an assembled perspective view of the first cable management mechanism 48 respectively. In this embodiment, a first hinge structure 96 is connected between the first arm member 56 and the second arm member 58 so that the first arm member 56 and the second arm member 58 can be brought close to each other and thus enter a folded state (or be extended from the folded state to a generally V-shaped extended state). Also, a second hinge structure 98 is connected between the first arm member 56 and the first connecting device 60, allowing the first connecting device 60 to rotate with respect to the first arm member 56. In addition, a first pivot member 100 connects the slider 66 to the first arm member 56 to enable rotation of the first arm member 56 relative to the slider 66, and a second pivot member 102 connects the second connecting device 64 to the second arm member 58 to enable rotation of the second connecting device 64 relative to the second arm member 58. Each of the arm members 56 and 58 has a cable supporting feature 104, such as a U-shaped structure, to facilitate storage and management of cables.

Referring to FIG. 5, the first connecting device 60 includes a first connecting section 106; a second connecting section 108 extending longitudinally from the first connecting section 106; an upper wall 110a and a lower wall 110b extending respectively from an upper edge and a lower edge of the first connecting section 106 such that a passage 112 is defined between the upper wall 110a, the lower wall 110b, and the first connecting section 106; a stop portion 114 provided between the first connecting section 106 and the second connecting section 108; a third connecting section 116 extending upward from the second connecting section 108 and higher than the upper wall 110a, wherein the third connecting section 116 is movably connected to the first arm member 56 of the first cable management mechanism 48 via the second hinge structure 98 (as shown in FIG. 3); an inserting portion 118 extending from the first connecting section 106 and partially beyond the passage 112, wherein the part of the inserting portion 118 that is outside the passage 112 has at least one engaging hole 120; and an engaging member 122 elastically connected to the inserting portion 118, wherein the engaging member 122 includes at least one engaging portion 124 corresponding to the at least one engaging hole 120 of the inserting portion 118, a releasing portion 126, and an elastic portion 128 provided between the at least one engaging portion 124 and the releasing portion 126. More specifically, the engaging member 122 is elastically connected to the inserting portion 118 via the elastic portion 128, and the at least one engaging portion 124 is engaged in the at least one engaging hole 120 of the inserting portion 118 in response to the elastic force provided by the elastic portion 128. Referring also to FIG. 5A, the supporting bracket 62 of the first cable management mechanism 48 is connected to and extends transversely from the second connecting section 108. In an embodiment, the supporting bracket 62 has a positioning hole 130 and a mounting hole 132 in communication with the positioning hole 130. Moreover, a positioning member 134 is elastically connected to the supporting bracket 62. The positioning member 134, which can be viewed as a part of the supporting bracket 62, has a blocking portion 136 corresponding to a position between the positioning hole 130 and the mounting hole 132.

As shown in FIG. 6, the second connecting device 64 includes a connecting member 138 and an engaging member 140 elastically connected to the connecting member 138. The connecting member 138 has an inserting portion 142 and an engaging hole 144. The engaging member 140 has generally the same configuration as the engaging member 122 and includes at least one engaging portion 146 corresponding to the engaging hole 144 of the connecting member 138, a releasing portion 148, and an elastic portion 150 provided between the engaging portion 146 and the releasing portion 148.

Figure 7:
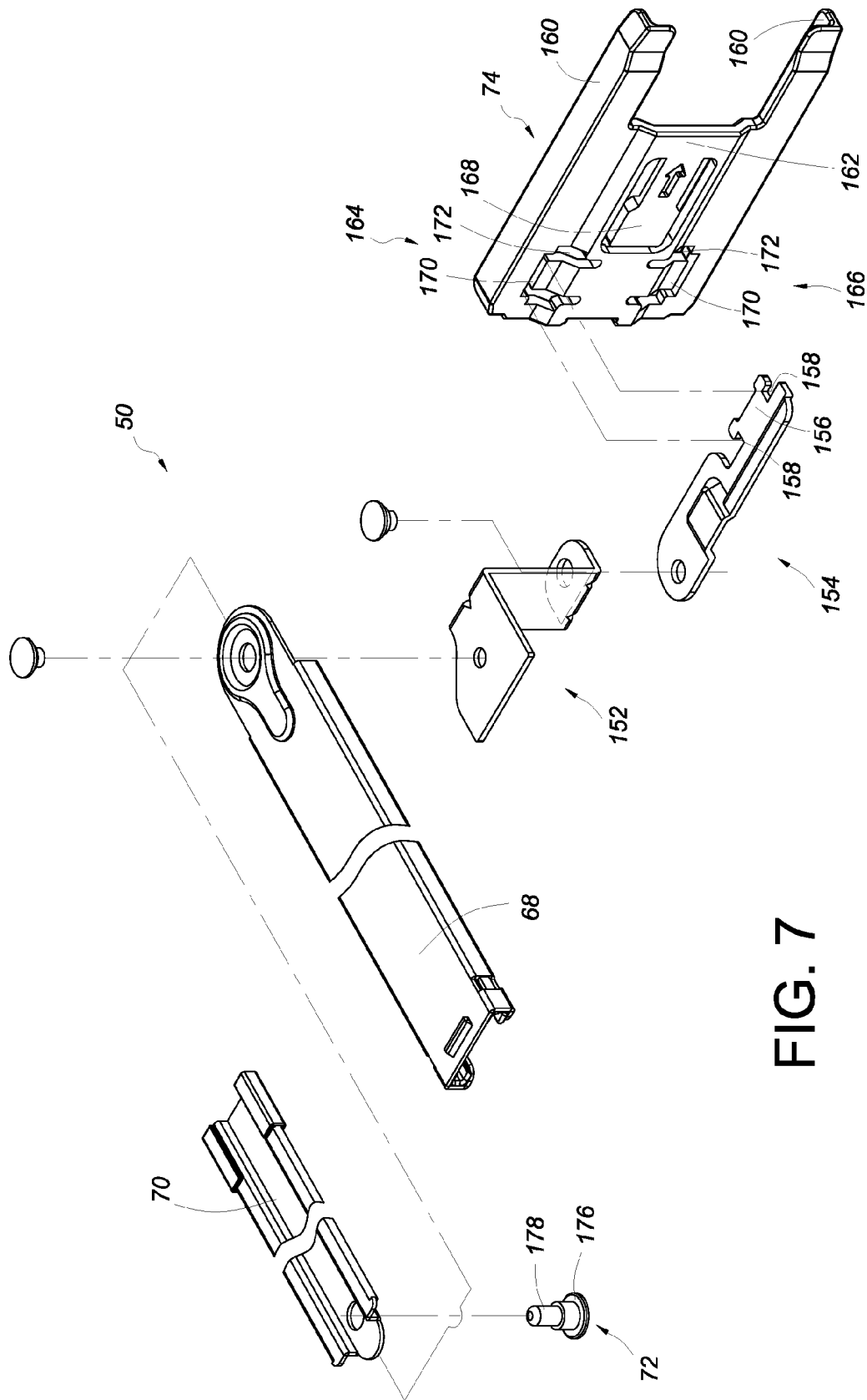
FIG. 7 is an exploded view of the first supporting mechanism of the cable management arm in an embodiment of the present invention.
Figure 8:
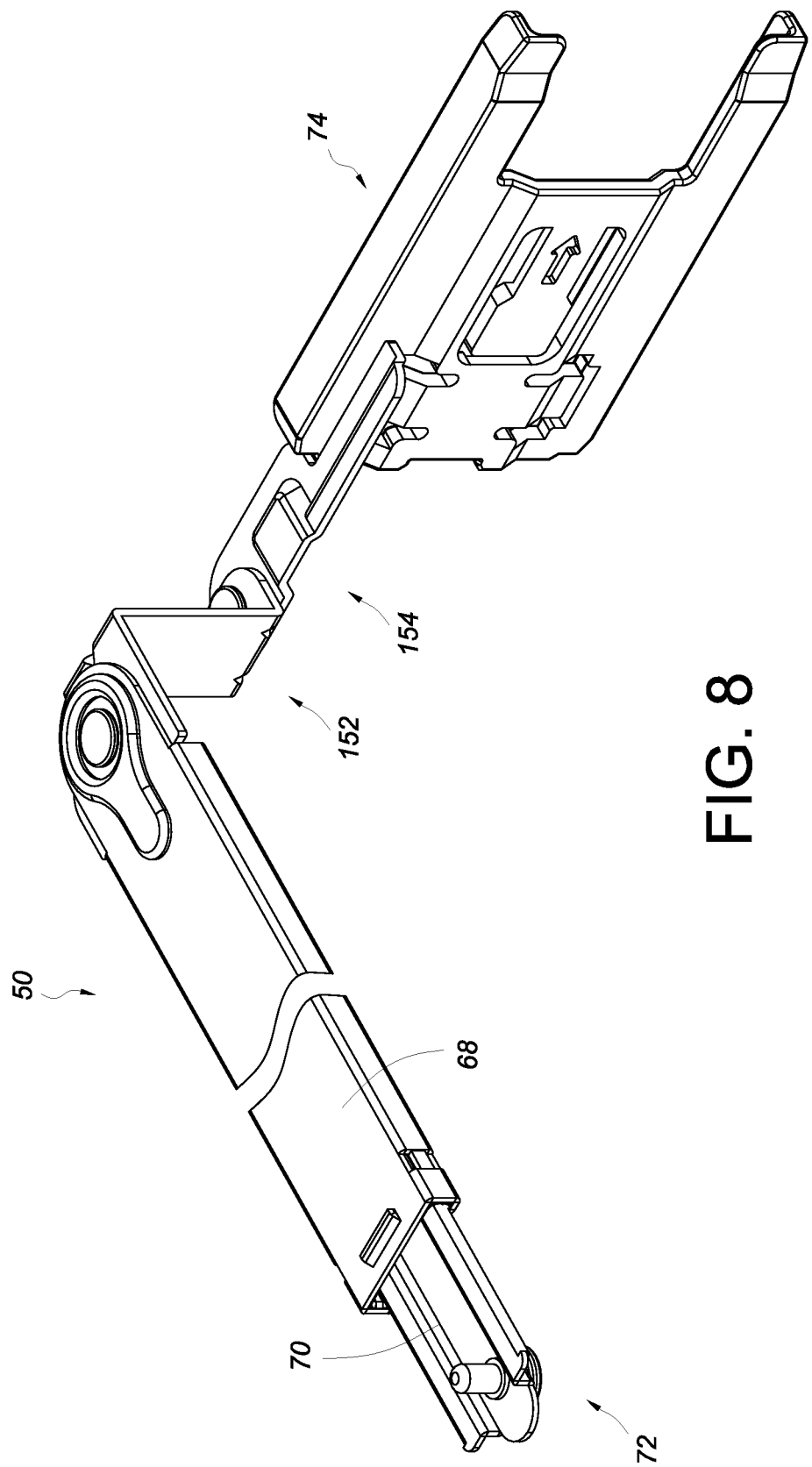
FIG. 8 is a perspective view of the first supporting mechanism of the cable management arm in an embodiment of the present invention.

Referring to FIG. 7 and FIG. 8 for a schematic exploded view and an assembled perspective view of the first supporting mechanism 50 respectively, the first supporting mechanism 50 further includes a hinge structure 152 and a swing arm 154. The hinge structure 152 is connected between the first supporting rail 68 and the swing arm 154, and the swing arm 154 is connected between the hinge structure 152 and the movable member 74, thus allowing the movable member 74 to rotate with respect to the first supporting rail 68. More specifically, the swing arm 154 has an engaging projection 156 and two engaging grooves 158, wherein the two engaging grooves 158 are located on two lateral sides of the engaging projection 156 respectively. The movable member 74 is formed of a flexible material such as plastic and includes a pair of sidewalls 160 and a lateral wall 162 extending between the pair of sidewalls 160. The lateral wall 162 has an upper engaging feature 164, a lower engaging feature 166, and an operation portion 168. During assembly, the engaging projection 156 of the swing arm 154 is engaged with, and thus fixed position with respect to, one of the upper engaging feature 164 and the lower engaging feature 166. More particularly, each of the engaging features 164 and 166 has an elastic block 170 and a groove 172 extending along the periphery of the elastic block 170. In this embodiment, the engaging projection 156 is inserted into the groove 172 of the upper engaging feature 164 such that not only is the wall of the movable member 74 engaged in the engaging grooves 158, but also the elastic block 170 presses against the engaging projection 156; consequently, the movable member 74 and the swing arm 154 are engaged with and fixed in position with respect to each other. And because of that, the first supporting mechanism 50 is located at a higher position than the movable member 74. For disassembly, the operator only has to press the elastic block 170 to release the elastic block 170 from engagement with the engaging projection 156, and the movable member 74 can be removed from the swing arm 154. Furthermore, the fastener 72 is fixedly connected to the second supporting rail 70 of the first supporting mechanism 50. The fastener 72 has a head 176 and a body 178 extending from the head 176. The outer diameter of the head 176 is greater than the outer diameter of the body 178.

Figure 9:
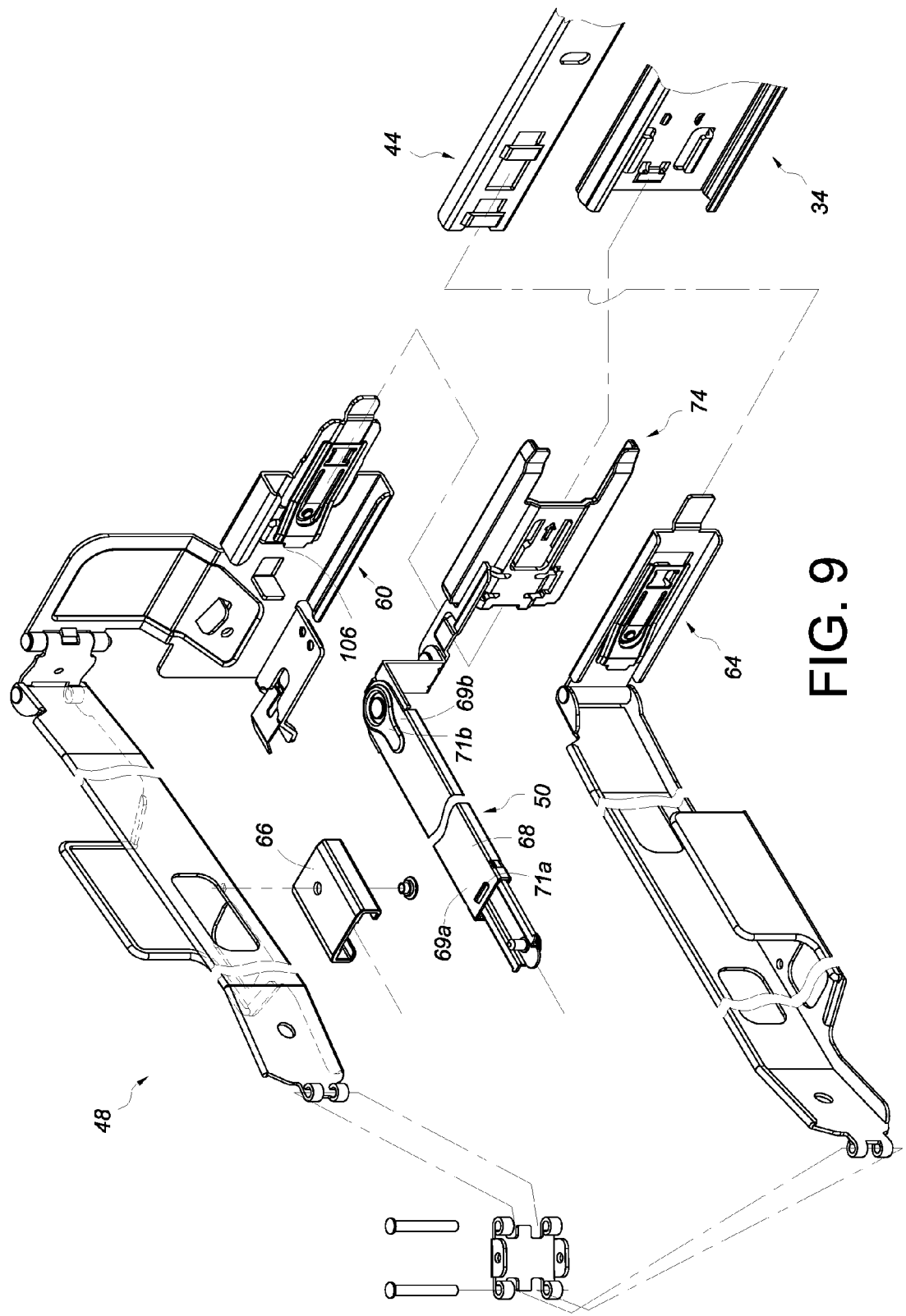
FIG. 9 is a schematic exploded view of the first cable management mechanism and the first supporting mechanism of the cable management arm in an embodiment of the present invention, wherein the second connecting device of the first cable management mechanism can be mounted to the first connecting base in a releasable manner, and wherein the first connecting device of the first cable management mechanism and the movable member of the first supporting mechanism can be jointly mounted to the first slide rail assembly in a releasable manner.

FIG. 9 shows how the first connecting section 106 of the first connecting device 60 of the first cable management mechanism 48 and the movable member 74 of the first supporting mechanism 50 can be jointly mounted to the first slide rail assembly 34, and how the second connecting device 64 of the first cable management mechanism 48 can be mounted to the first connecting base 44, which is adjacent to a lateral side of the chassis 32. The first supporting rail 68 of the first supporting mechanism 50 includes a first portion 69a and a second portion 69b. Each of the first portion 69a and the second portion 69b has a position-limiting element (e.g., a first position-limiting element 71a and a second position-limiting element 71b respectively). Thus, the slider 66 of the first cable management mechanism 48 is limited between the position-limiting elements when displaced along the first supporting rail 68 of the first supporting mechanism 50.

Figure 10:
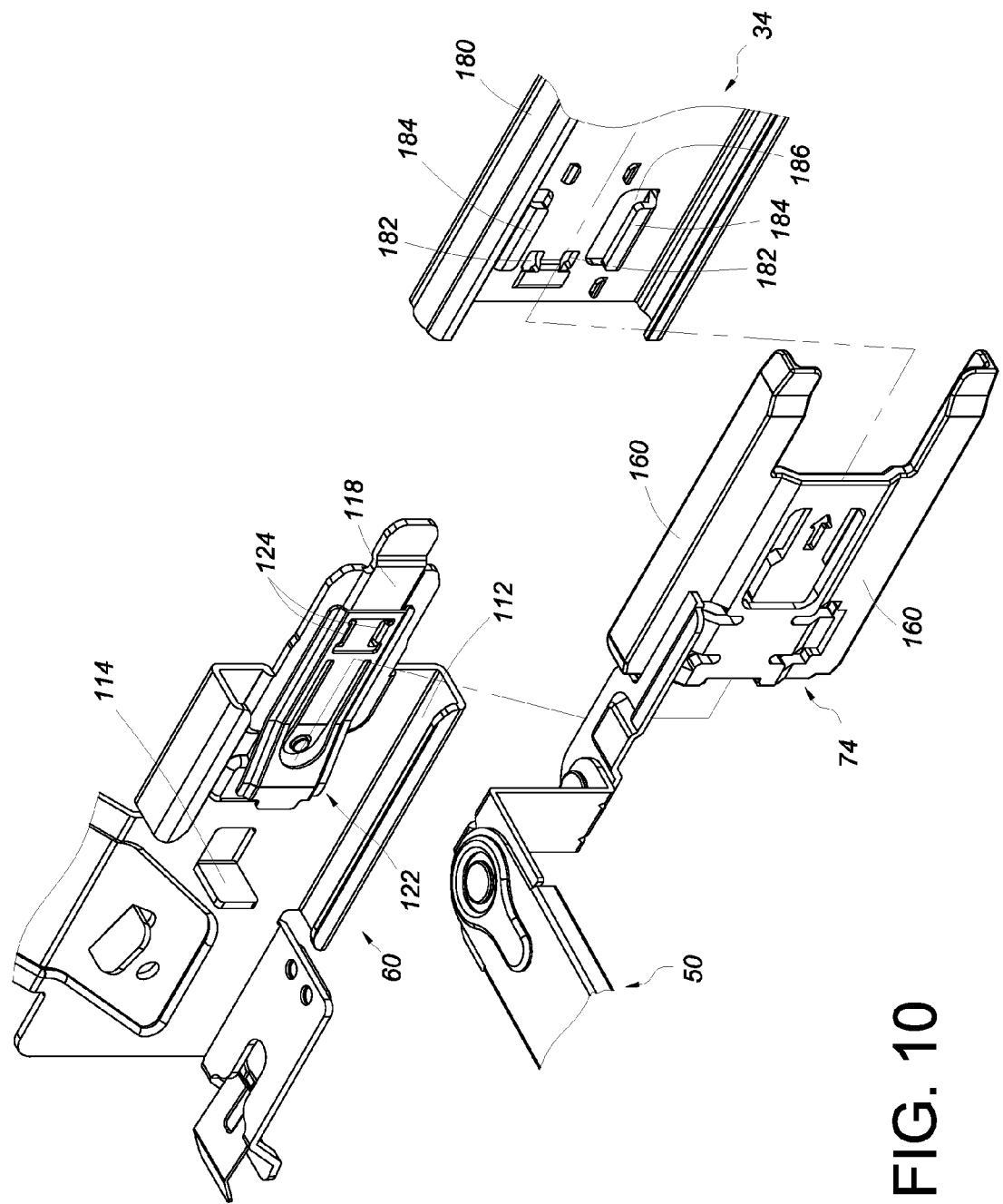
FIG. 10 is a partial schematic drawing showing how the first connecting device of the first cable management mechanism of the cable management arm in an embodiment of the present invention and the movable member of the first supporting mechanism can be jointly mounted to the first slide rail assembly in a releasable manner.
Figure 11:
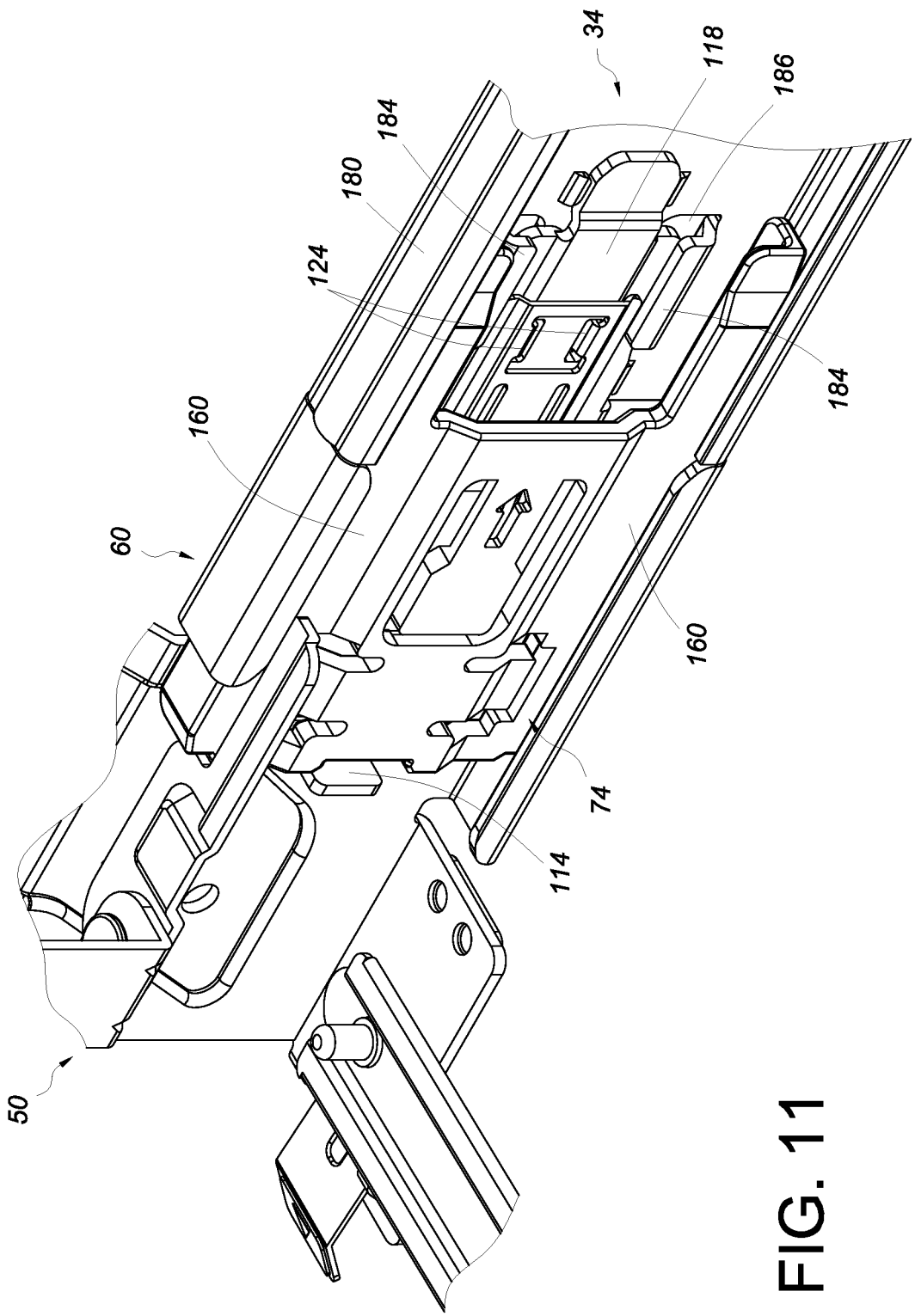
FIG. 11 is a partial perspective view showing how the first connecting device of the first cable management mechanism of the cable management arm in an embodiment of the present invention and the movable member of the first supporting mechanism are jointly mounted to the first slide rail assembly.

Referring to FIG. 10 and FIG. 11, the first connecting device 60 of the first cable management mechanism 48 and the movable member 74 of the first supporting mechanism 50 can be jointly mounted to one of the rails (e.g., a fixed rail 180) of the first slide rail assembly 34. The fixed rail 180 has a pair of connecting holes 182. Preferably, the fixed rail 180 further includes at least one pair of curved fixing elements 184, and the pair of fixing elements 184 define a channel 186. During assembly, the two sidewalls 160 of the movable member 74 of the first supporting mechanism 50 are mounted into the passage 112 of the first connecting device 60 of the first cable management mechanism 48 such that the movable member 74 of the first supporting mechanism 50 is pressed against the stop portion 114 of the first connecting device 60 and thus reaches a retracted position relative to the first connecting device 60 and the fixed rail 180 of the first slide rail assembly 34. In this position, the at least one engaging portion 124 of the engaging member 122 is correspondingly engaged with the pair of connecting holes 182 of the fixed rail 180, and the inserting portion 118 of the first connecting device 60 of the first cable management mechanism 48 is correspondingly inserted into the channel 186 of the fixed rail 180 of the first slide rail assembly 34 and stopped by the pair of fixing elements 184. Consequently, the first connecting device 60 of the first cable management mechanism 48 is securely mounted to the fixed rail 180 of the first slide rail assembly 34, allowing the movable member 74 of the first supporting mechanism 50 to stay within the first connecting device 60 of the first cable management mechanism 48 and the fixed rail 180 of the first slide rail assembly 34.

Figure 12:
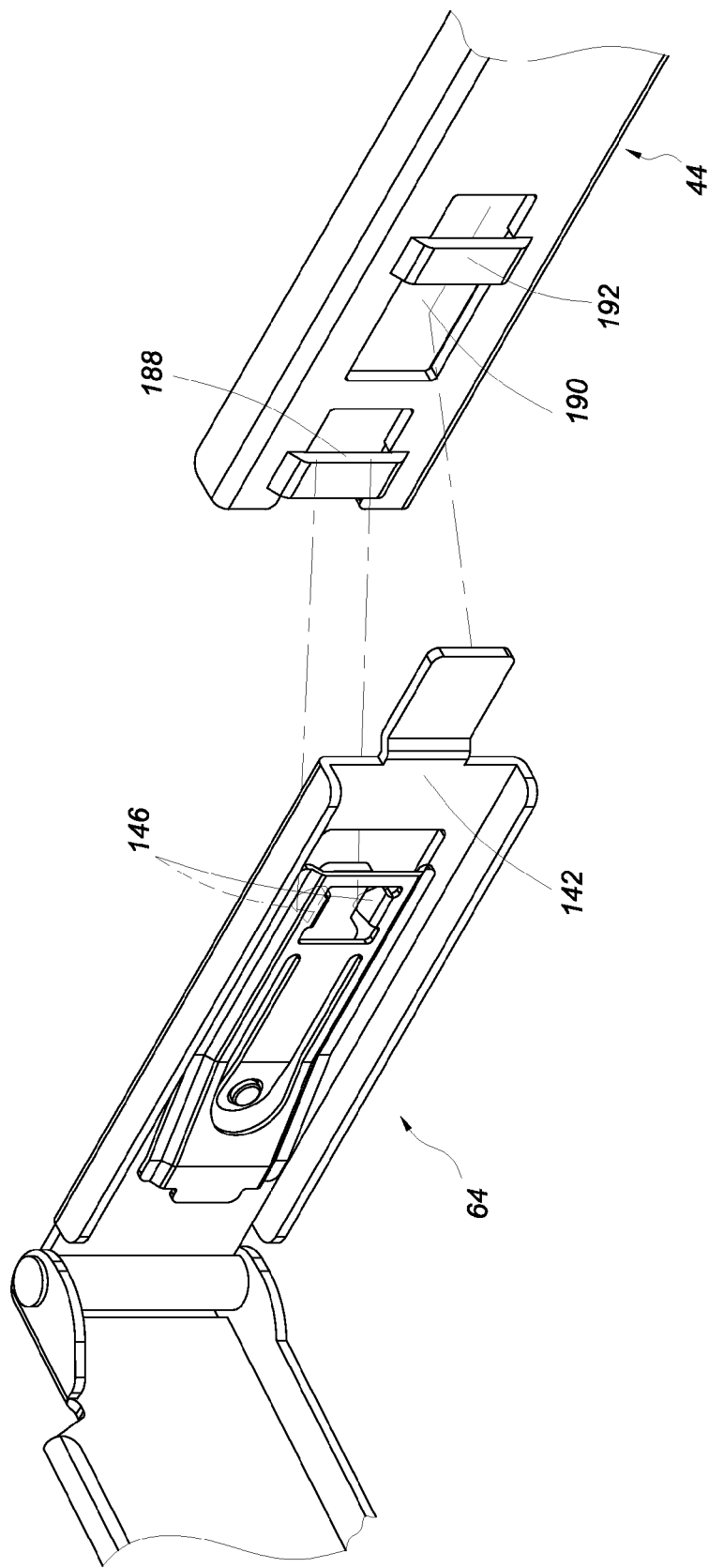
FIG. 12 is an exploded view of the second connecting device of the first cable management mechanism of the cable management arm in an embodiment of the present invention and the first connecting base.
Figure 13:
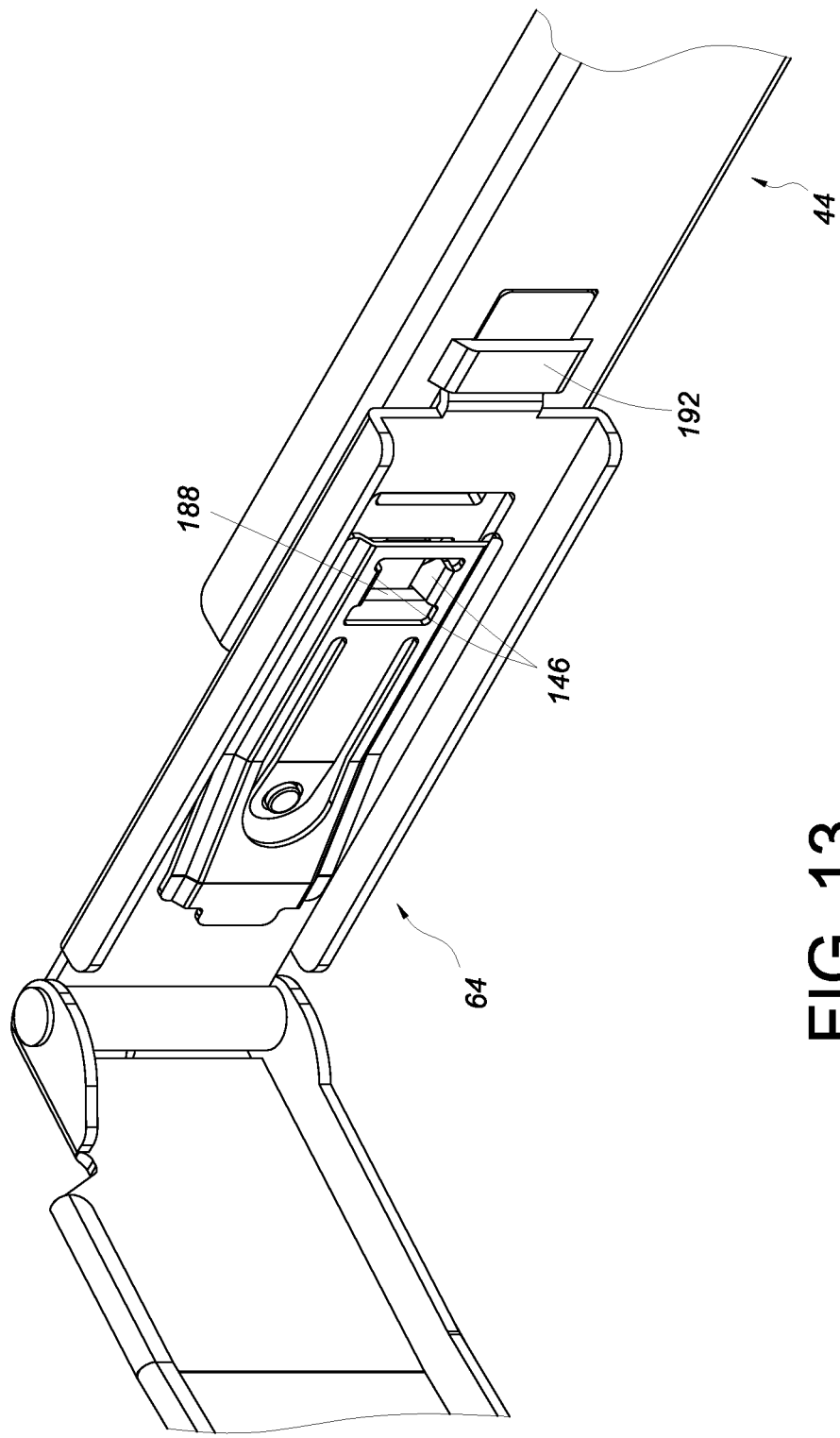
FIG. 13 is an assembled perspective view of the second connecting device of the first cable management mechanism of the cable management arm in an embodiment of the present invention and the first connecting base.

Referring to FIG. 12 and FIG. 13, the first connecting base 44 on a lateral side of the chassis 32 includes a stop portion 188 and preferably further includes an insertion opening 190 and a stop wall 192. During assembly, the engaging portion 146 of the second connecting device 64 of the first cable management mechanism 48 is correspondingly engaged with the stop portion 188 of the first connecting base 44, and the inserting portion 142 of the second connecting device 64 of the first cable management mechanism 48 is correspondingly inserted into the insertion opening 190 of the first connecting base 44 and stopped by the stop wall 192. In consequence, the second connecting device 64 of the first cable management mechanism 48 is securely mounted to the first connecting base 44.

Figure 14:
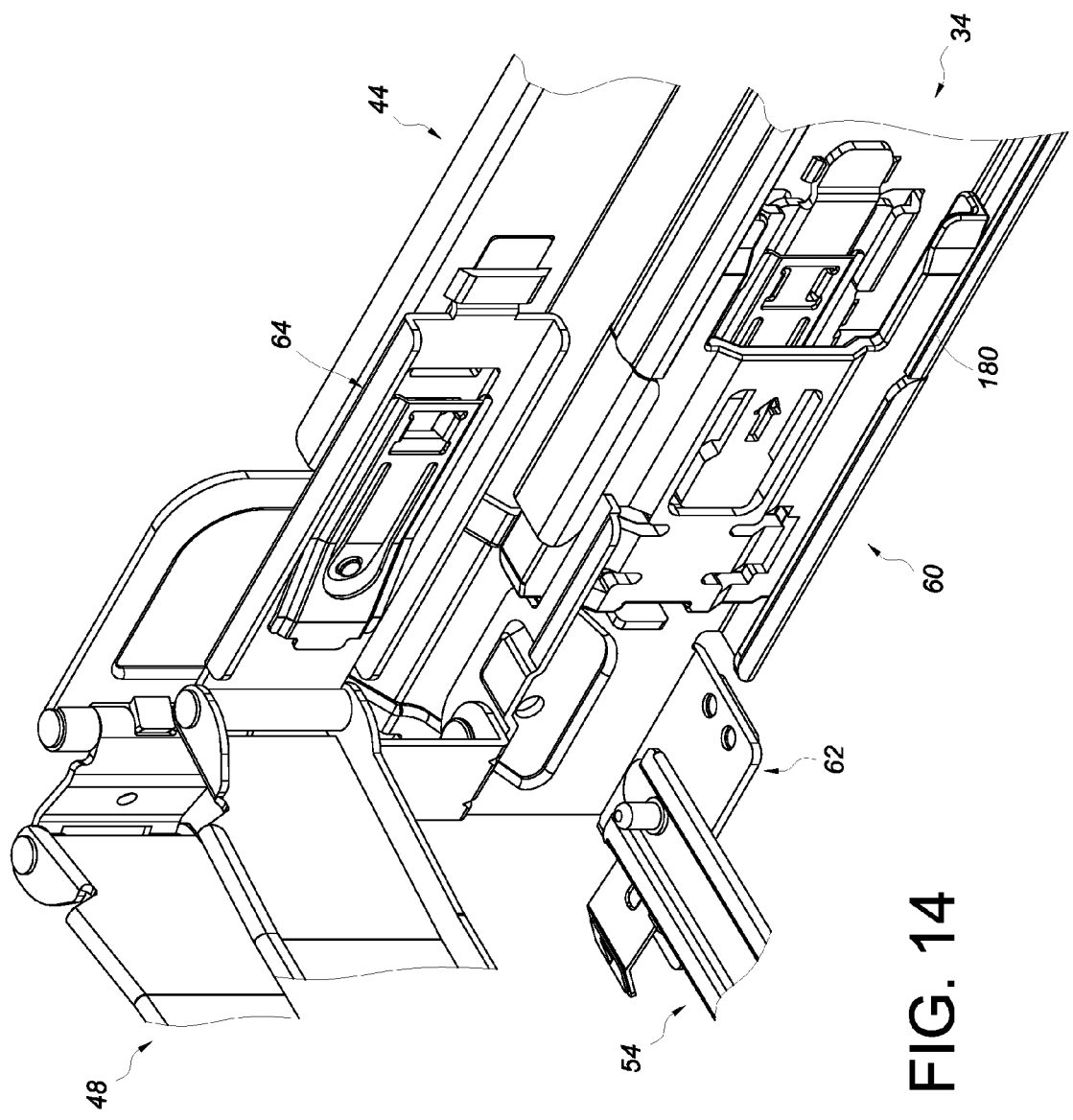
FIG. 14 is an assembled perspective view showing how the second connecting device of the first cable management mechanism of the cable management arm in an embodiment of the present invention is mounted to the first connecting base, and how the first connecting device of the first cable management mechanism and the movable member of the first supporting mechanism are jointly mounted to the first slide rail assembly.

In FIG. 14, the first connecting device 60 and the second connecting device 64 of the first cable management mechanism 48 are respectively mounted to the fixed rail 180 of the first slide rail assembly 34 and the first connecting base 44. In addition, the second supporting mechanism 54 is mounted to the supporting bracket 62 of the first cable management mechanism 48.

Figure 15:
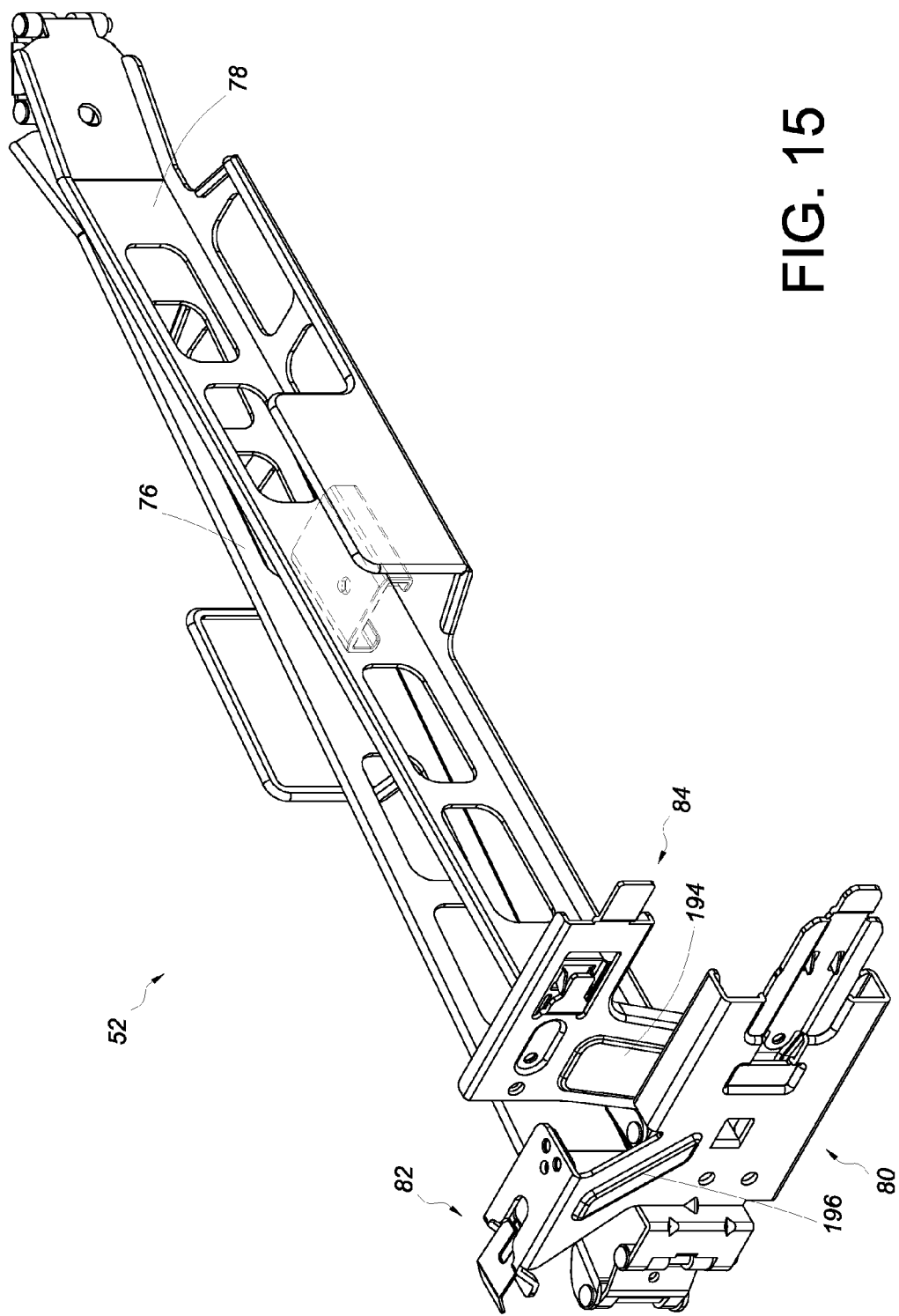
FIG. 15 is a perspective view of the second cable management mechanism of the cable management arm in an embodiment of the present invention.

FIG. 15 is an assembled perspective view of the second cable management mechanism 52. The second cable management mechanism 52 is different from the first cable management mechanism 48 generally in that the second cable management mechanism 52 includes a first extension 194 and a second extension 196. The first extension 194 is connected to the second connecting device 84 such that the second connecting device 84 is at a higher position than the second arm member 78 of the second cable management mechanism 52. The second extension 196 is connected to the supporting bracket 82 such that the supporting bracket 82 is located above the first connecting device 80 of the second cable management mechanism 52.

Figure 16:
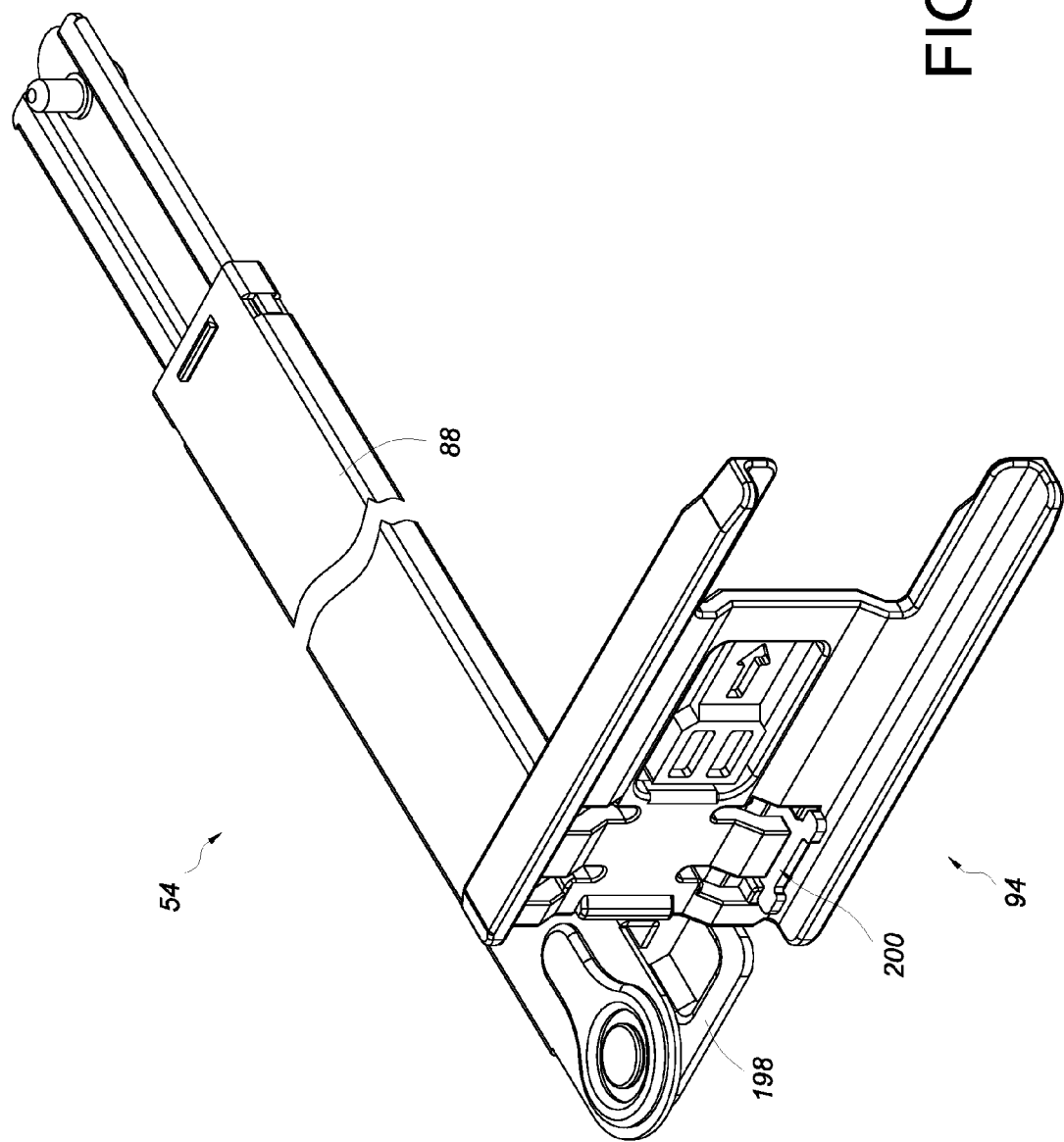
FIG. 16 is a perspective view of the second supporting mechanism of the cable management arm in an embodiment of the present invention.

FIG. 16 is a schematic assembled view of the second supporting mechanism 54. The second supporting mechanism 54 is different from the first supporting mechanism 50 generally in that the second supporting mechanism 54 has a swing arm 198 movably connected between the movable member 94 and the first supporting rail 88 of the second supporting mechanism 54. The swing arm 198 has one end engaged with a lower engaging feature 200 of the movable member 94 such that the movable member 94 is at a higher position than the second supporting mechanism 54.

Figure 17:
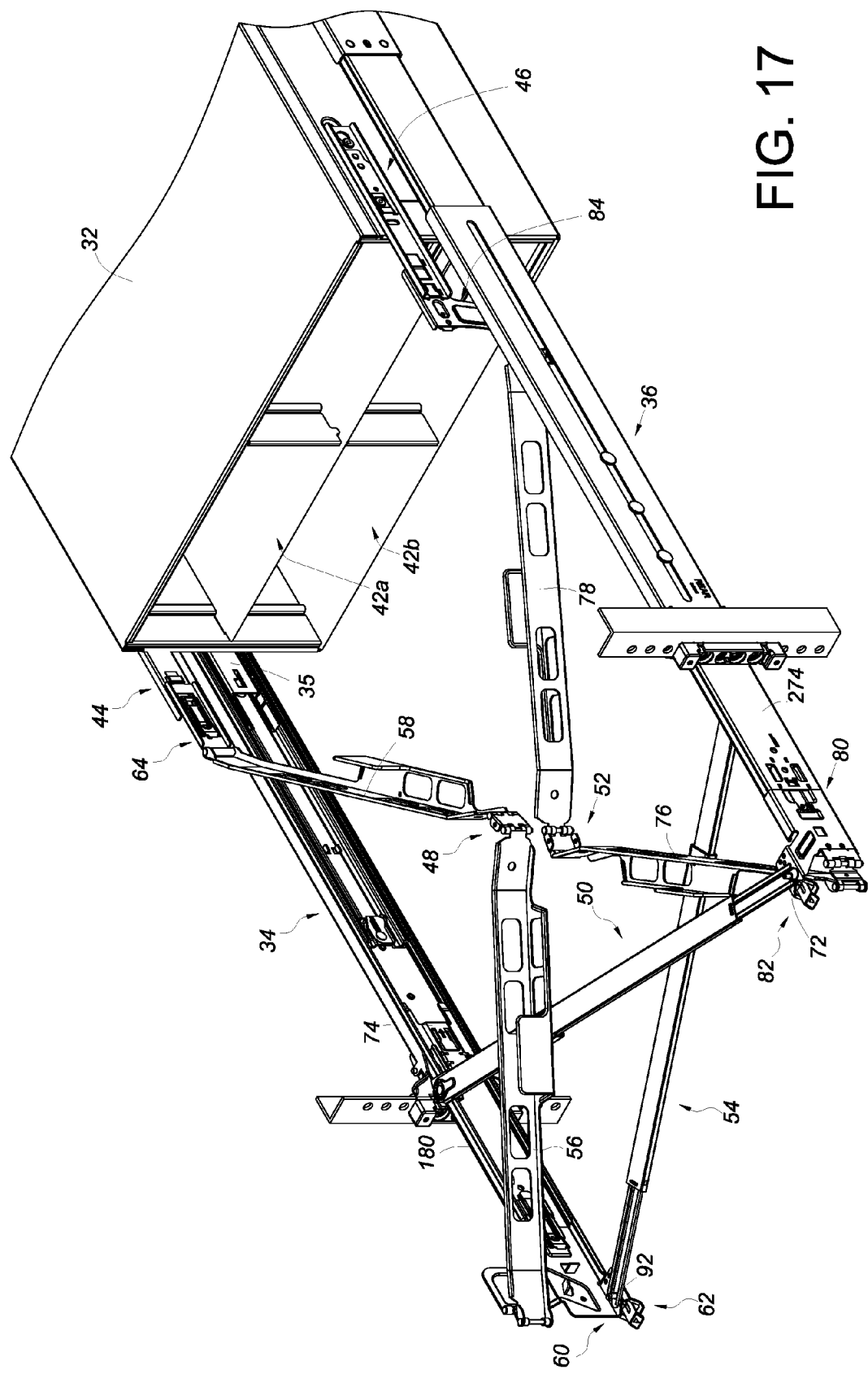
FIG. 17 is a schematic perspective view showing how the cable management arm in an embodiment of the present invention is pulled out along with a chassis and hence enters an extended state.

As shown in FIG. 17, the first connecting device 60 of the first cable management mechanism 48 is generally parallel to the first connecting device 80 of the second cable management mechanism 52 (e.g., the first connecting device 60 of the first cable management mechanism 48 and the first connecting device 80 of the second cable management mechanism 52 being on the same horizontal plane). Meanwhile, the supporting bracket 62 of the first cable management mechanism 48 is adjacent to and below the first connecting device 60 of the first cable management mechanism 48. Therefore, by mounting the fastener 92 of the second supporting mechanism 54 to the supporting bracket 62 of the first cable management mechanism 48, the second cable management mechanism 52 is arranged below the first cable management mechanism 48. On the other hand, the supporting bracket 82 of the second cable management mechanism 52 is adjacent to and above the first connecting device 80 of the second cable management mechanism 52 so that, by mounting the fastener 72 of the first supporting mechanism 50 to the supporting bracket 82 of the second cable management mechanism 52, the first cable management mechanism 48 is arranged above the second cable management mechanism 52. Hence, the first arm member 56 and the second arm member 58 of the first cable management mechanism 48 generally correspond in position, and are applicable, to the upper-tier area 42a of the chassis 32 and serve to hold cables connected to or extending from the rear side of the upper-tier area 42a of the chassis 32. On the other hand, the first arm member 76 and the second arm member 78 of the second cable management mechanism 52 generally correspond in position, and are applicable, to the lower-tier area 42b of the chassis 32 and serve to hold cables connected to or extending from the rear side of the lower-tier area 42b of the chassis 32.

FIG. 18A~FIG. 18C show how the first connecting device 60 of the first cable management mechanism 48 and the movable member 74 of the first supporting mechanism 50 are jointly mounted to the fixed rail 180 of the first slide rail assembly 34 in a releasable manner. To release the foregoing elements from the connected state, the operator can operate the releasing portion 126 of the engaging member 122 by applying a force F thereto indirectly (i.e., through the operation portion 168 of the movable member 74 of the first supporting mechanism 50) while the movable member 74 of the first supporting mechanism 50 is at a retracted position relative to the first connecting device 60 of the first cable management mechanism 48, and the at least one engaging portion 124 of the engaging member 122 will be disengaged from the at least one connecting hole 182 of the fixed rail 180 and from the at least one engaging hole 120 of the first connecting device 60. Then, the first connecting device 60 of the first cable management mechanism 48 and the movable member 74 of the first supporting mechanism 50 can be moved together in a direction D in order to be detached from the fixed rail 180 of the first slide rail assembly 34.

Figure 19A:
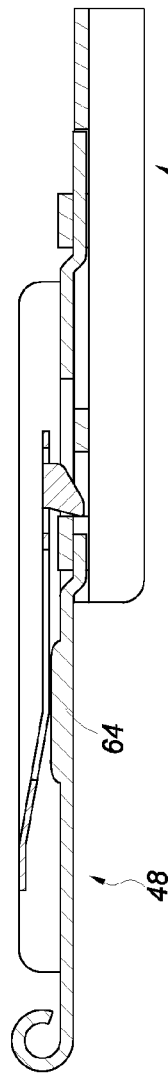
FIG. 19A shows how the second connecting device of a cable management mechanism of the cable management arm in an embodiment of the present invention is assembled to a connecting base.
Figure 19B:
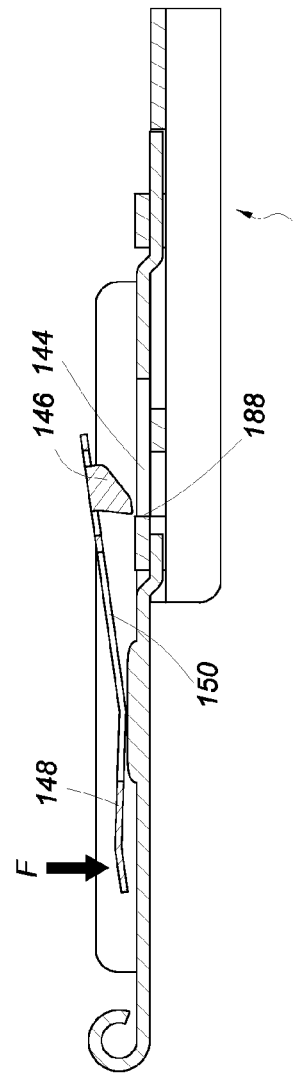
FIG. 19B shows how the second connecting device in FIG. 19A is detached from the connecting base.
Figure 19C:
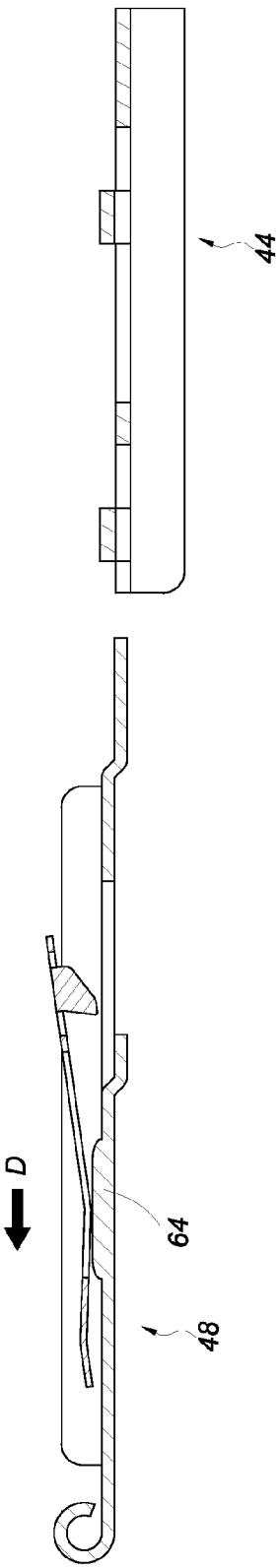
FIG. 19C further shows how the second connecting device in FIG. 19A is detached from the connecting base.

Referring to FIG. 19A~FIG. 19C, when it is desired to release the second connecting device 64 of the first cable management mechanism 48 and the first connecting base 44 from the connected state, the operator can operate the releasing portion 148 of the second connecting device 64 by applying a force F thereto to overcome the elastic force provided by the elastic portion 150 of the second connecting device 64, thereby disengaging the at least one engaging portion 146 of the second connecting device 64 from the engaging hole 144 of the connecting member 138 and from the stop portion 188 of the first connecting base 44. Then, the second connecting device 64 of the first cable management mechanism 48 can be detached from the first connecting base 44 in a direction D.

After the second connecting device 64 of the first cable management mechanism 48 is released from the first connecting base 44 on the chassis 32, the electronic parts and/or equipment in the upper-tier area 42a of the chassis 32 can be inspected, repaired, or replaced with ease. Similarly, the electronic parts and/or equipment in the lower-tier area 42b of the chassis 32 can be easily inspected, repaired, or replaced once the second connecting device 84 of the second cable management mechanism 52 is released from the second connecting base 46 on the chassis 32.

Figure 20A:
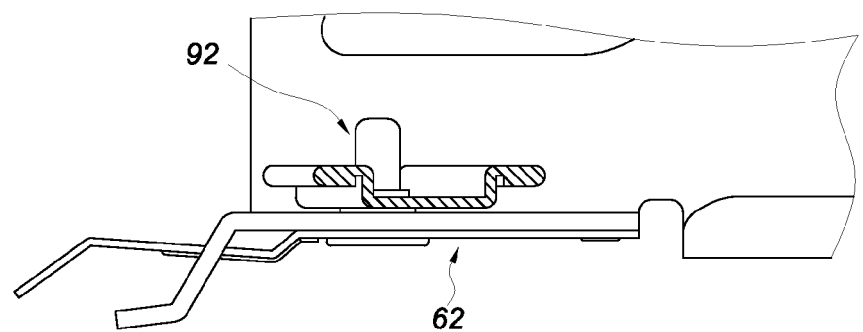
FIG. 20A shows how the fastener of a supporting mechanism of the cable management arm in an embodiment of the present invention is assembled to the supporting bracket of a cable management mechanism.
Figure 20B:
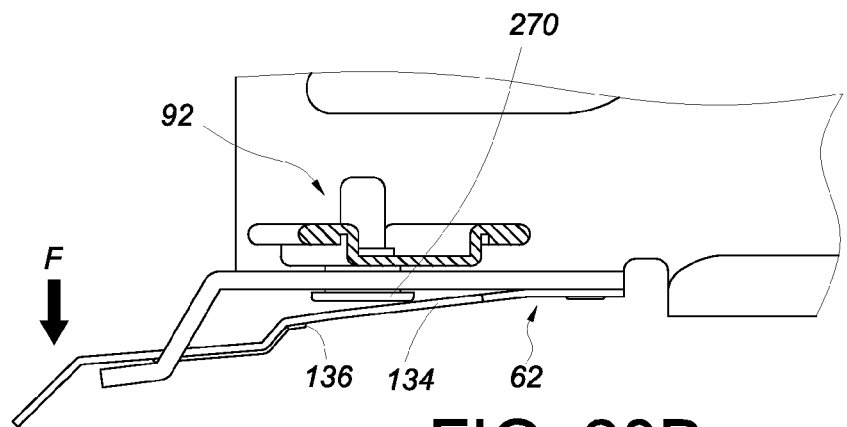
FIG. 20B shows how the fastener in FIG. 20A is detached from the supporting bracket of the cable management mechanism.
Figure 20C:
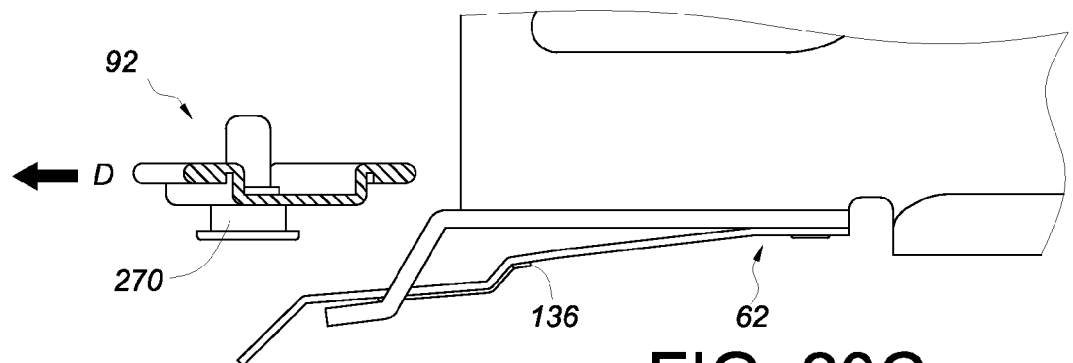
FIG. 20C further shows how the fastener in FIG. 20A is detached from the supporting bracket of the cable management mechanism.

Referring to FIG. 20A~FIG. 20C, if it is desired to release the fastener 92 of the second supporting mechanism 54 and the supporting bracket 62 of the first cable management mechanism 48 from the connected state, in which the head 270 of the fastener 92 of the second supporting mechanism 54 is mounted in the positioning hole 130 of the supporting bracket 62 of the first cable management mechanism 48 (see FIG. 5 and FIG. 5A), the operator can operate the positioning member 134 of the first connecting device 60 of the first cable management mechanism 48 by applying a force F thereto such that the blocking portion 136 of the positioning member 134 no longer blocks the head 270 of the fastener 92 of the second supporting mechanism 54. Then, the second supporting mechanism 54 can be moved in a direction D so as to be detached from the supporting bracket 62 of the first cable management mechanism 48.

Figure 21:
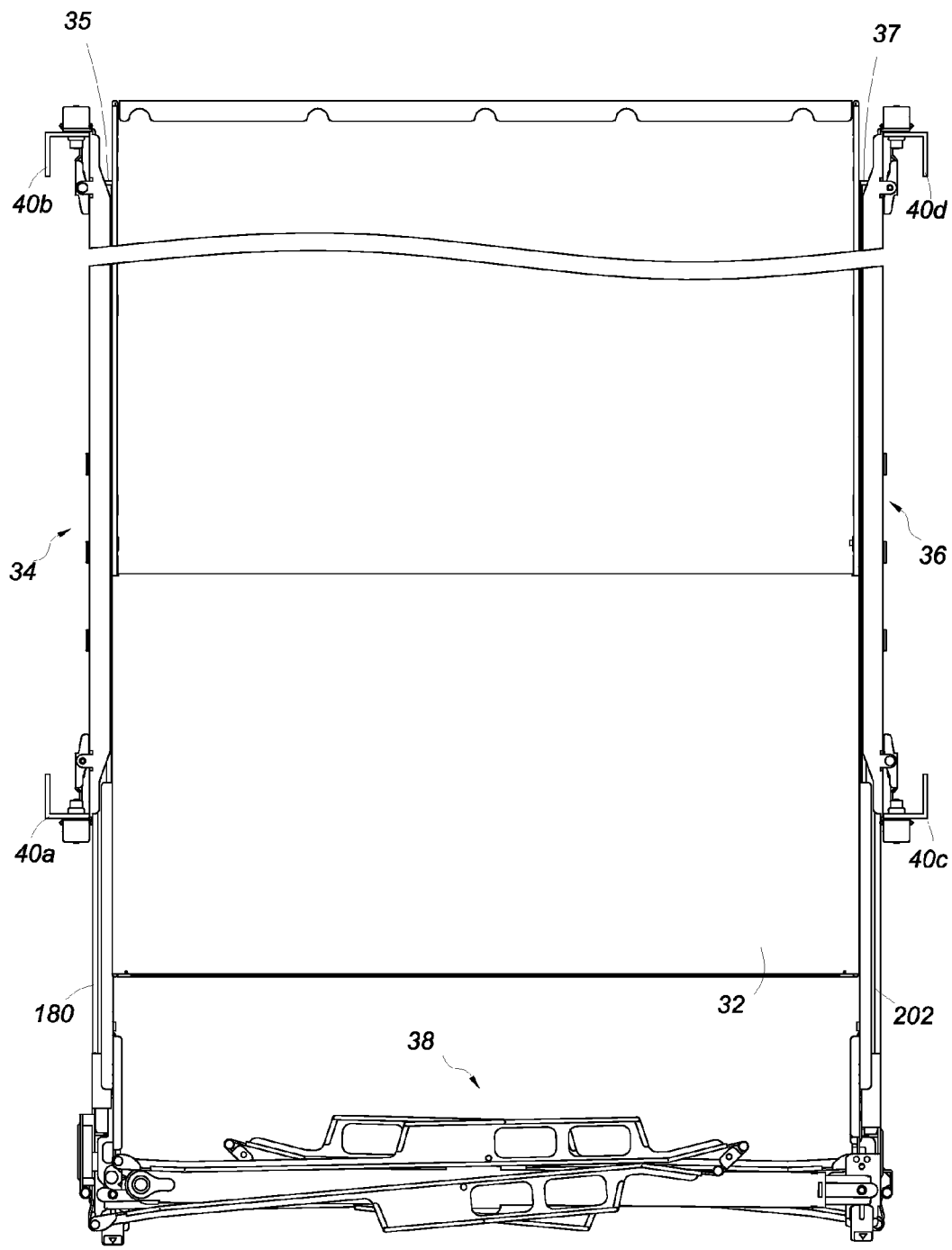
FIG. 21 schematically shows how the cable management arm in an embodiment of the present invention is mounted to a rack and a chassis, wherein the cable management arm is in a folded state.

Referring to FIG. 21, the cable management arm 38 is in a folded state when the movable rails of slide rail assemblies (e.g., the movable rail 35 of the first slide rail assembly 34 and a movable rail 37 of the second slide rail assembly 36) are at a retracted position relative to the fixed rails of the slide rail assemblies (e.g., the fixed rail 180 of the first slide rail assembly 34 and a fixed rail 202 of the second slide rail assembly 36).

Figure 22:
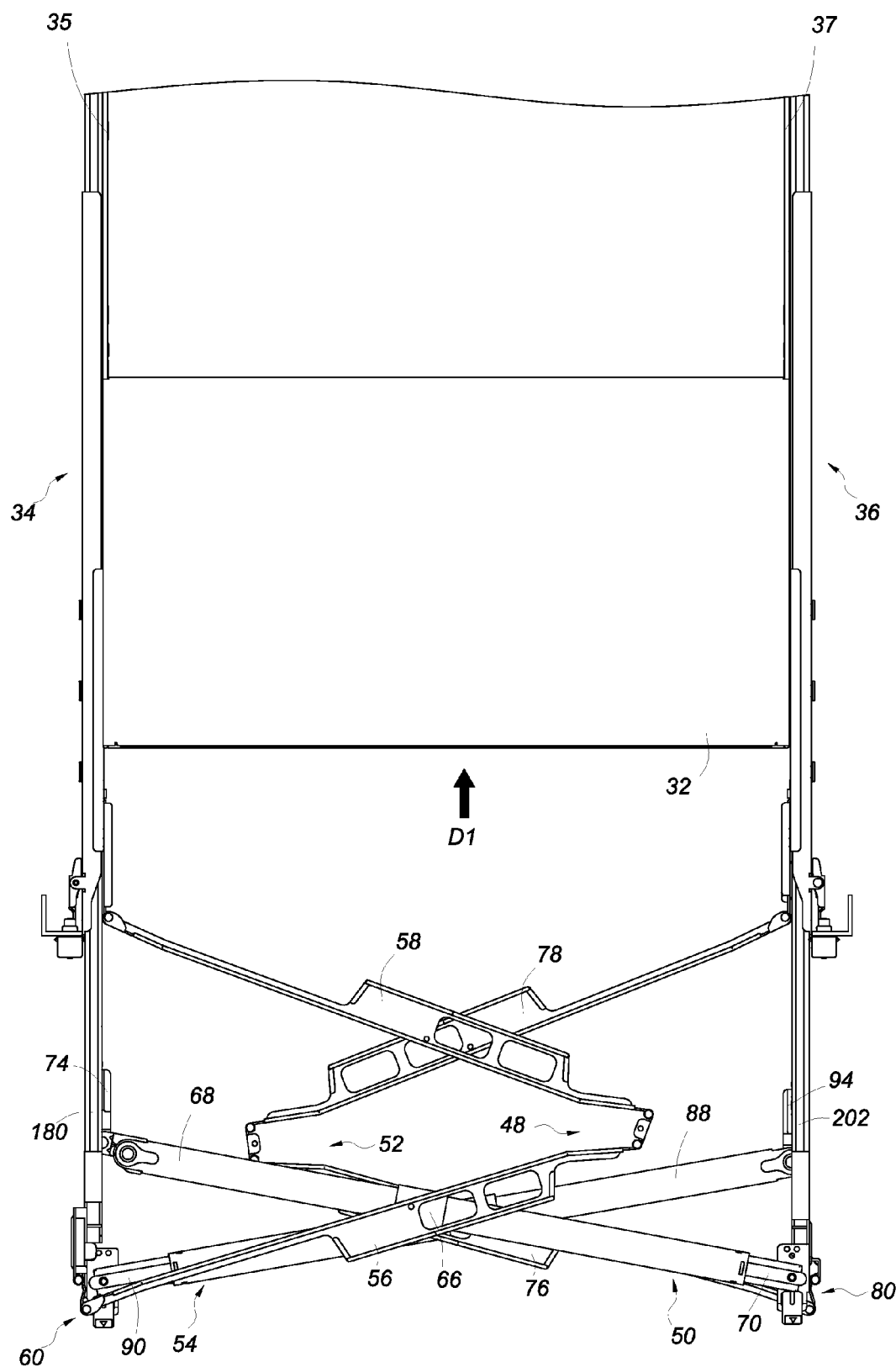
FIG. 22 schematically shows how the cable management arm in an embodiment of the present invention is mounted to a rack and a chassis, wherein the cable management arm is gradually extended from a folded state to an extended state.

Referring to FIG. 22, when the movable rails of the slide rail assemblies (e.g., the movable rail 35 of the first slide rail assembly 34 and the movable rail 37 of the second slide rail assembly 36) are longitudinally displaced in a direction D1 from the retracted position toward an extended position relative to the fixed rails (e.g., the fixed rail 180 of the first slide rail assembly 34 and the fixed rail 202 of the second slide rail assembly 36), the chassis 32 is displaced with the movable rails. Consequently, the second arm member 58 of the first cable management mechanism 48 is gradually extended relative to the first arm member 56, and the second arm member 78 of the second cable management mechanism 52 is gradually extended relative to the first arm member 76. In the meantime, the slider 66 and the slider 86 (not shown) drive the first supporting rail 68 of the first supporting mechanism 50 and the first supporting rail 88 of the second supporting mechanism 54 respectively, and the movable member 74 and the movable member 94 are displaced in the direction D1 toward the extended position within the fixed rail 180 of the first slide rail assembly 34 and the fixed rail 202 of the second slide rail assembly 36 relative to the first connecting device 60 and the first connecting device 80 respectively. As to the first and the second supporting mechanisms 50 and 54, their first supporting rails 68 and 88 are linearly extended relative to the second supporting rails 70 and 90 while supporting the first arm member 56 of the first cable management mechanism 48 and the first arm member 76 of the second cable management mechanism 52 respectively.

Figure 23:
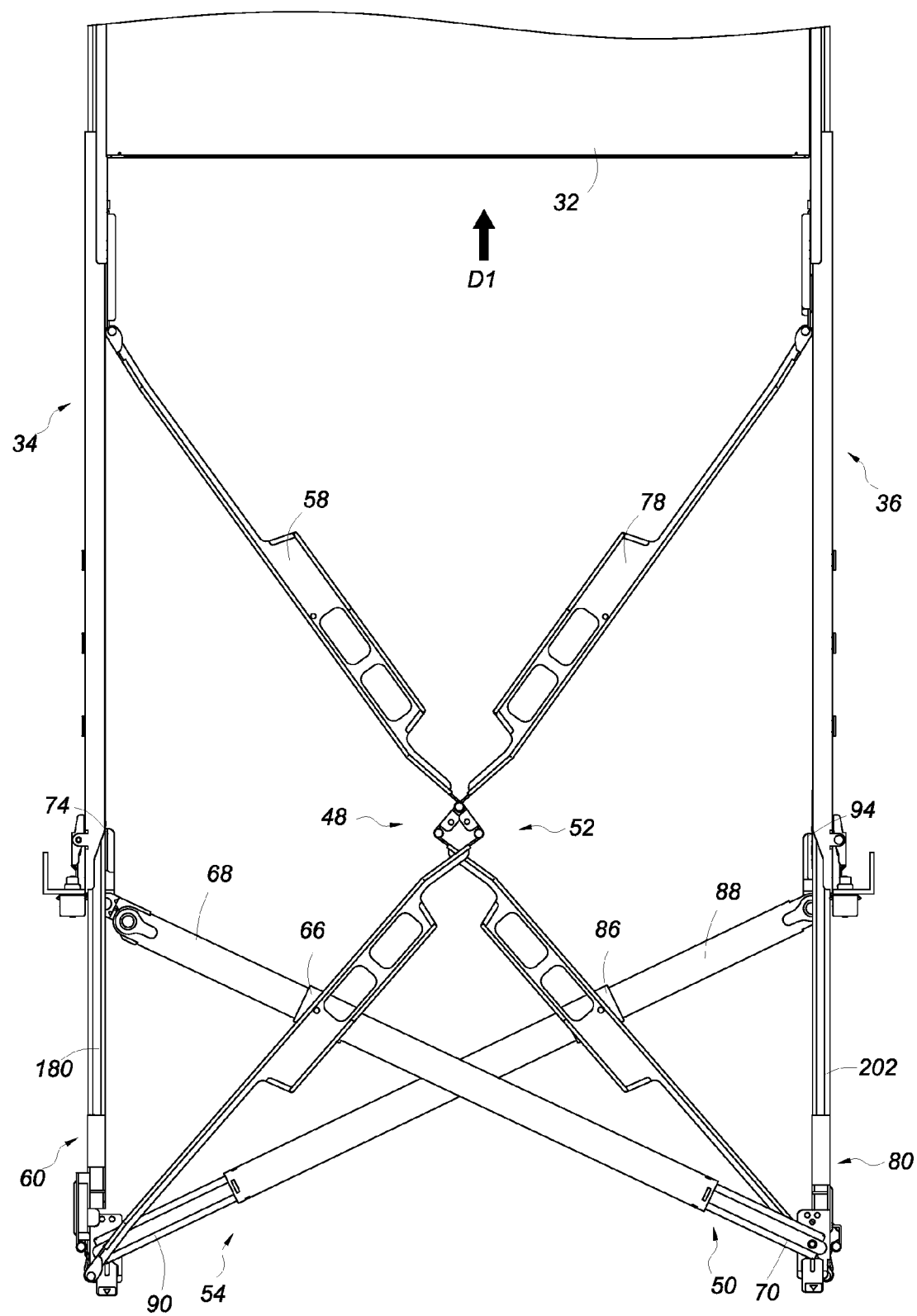
FIG. 23 schematically shows how the cable management arm in an embodiment of the present invention is mounted to a rack and a chassis, wherein the cable management arm is in an extended state.

Referring to FIG. 23, when the movable rails of the slide rail assemblies are further displaced in the direction D1 toward the extended position relative to the fixed rails (e.g., the fixed rail 180 of the first slide rail assembly 34 and the fixed rail 202 of the second slide rail assembly 36), the second arm member 58 of the first cable management mechanism 48 is further extended relative to the first arm member 56, and the second arm member 78 of the second cable management mechanism 52 is further extended relative to the first arm member 76. At the same time, the sliders 66 and 86 further drive the first supporting rail 68 of the first supporting mechanism 50 and the first supporting rail 88 of the second supporting mechanism 54 respectively, and the movable members 74 and 94 are further displaced in the direction D1 toward the extended position within the fixed rail 180 of the first slide rail assembly 34 and the fixed rail 202 of the second slide rail assembly 36 relative to the first connecting devices 60 and 80 respectively. Also, the first supporting rail 68 of the first supporting mechanism 50 and the first supporting rail 88 of the second supporting mechanism 54 are further linearly extended relative to the second supporting rail 70 and the second supporting rail 90 respectively while supporting the first arm member 56 of the first cable management mechanism 48 and the first arm member 76 of the second cable management mechanism 52 respectively.

It is worth mentioning that, when the movable rails of the slide rail assemblies are displaced toward the retracted position relative to the fixed rails (e.g., the fixed rail 180 of the first slide rail assembly 34 and the fixed rail 202 of the second slide rail assembly 36) (i.e., in a direction opposite the direction D1 toward the extended position), the second arm member 58 of the first cable management mechanism 48 and the second arm member 78 of the second cable management mechanism 52 are retracted relative to the first arm member 56 of the first cable management mechanism 48 and the first arm member 76 of the second cable management mechanism 52 respectively. As a result, the first supporting rail 68 of the first supporting mechanism 50 and the first supporting rail 88 of the second supporting mechanism 54 are brought back to the retracted state relative to the second supporting rail 70 of the first supporting mechanism 50 and the second supporting rail 90 of the second supporting mechanism 54 respectively.

While the present invention has been disclosed through the foregoing preferred embodiments, it is understood that the embodiments are not intended to be restrictive of the invention. The scope of patent protection sought is defined by the appended claims.

The invention claimed is:

1. A cable management arm, comprising:

a first cable management mechanism including: a first arm member; a second arm member connected to the first arm member; a first connecting device connected to the first arm member, the first connecting device including a first connecting section, a second connecting section, and a passage at the first connecting section; a supporting bracket connected to the second connecting section; and a second connecting device connected to the second arm member;

a first supporting mechanism including; a first supporting rail for supporting one of the first arm member and the second arm member of the first cable management mechanism; a second supporting rail telescopically connected to the first supporting rail; a movable member connected to the first supporting rail, the movable member being movably mounted to the passage of the first connecting device of the first cable management mechanism; and a fastener connected to the second supporting rail;

a second cable management mechanism including: a first arm member; a second arm member connected to the first arm member; a first connecting device connected to the first arm member, the first connecting device including an extension; a supporting bracket connected to the extension, the supporting bracket being releasably connected to the fastener of the first supporting mechanism; and a second connecting device connected to the second arm member; and a second supporting mechanism including: a first supporting rail for supporting one of the first arm member and the second arm member of the second cable management mechanism; a second supporting rail telescopically connected to the first supporting rail; a movable member connected to the first supporting rail, the movable member being movably mounted to the first connecting device of the second cable management mechanism; and a fastener connected to the second supporting rail, the fastener being releasably mounted to the supporting bracket of the first cable management mechanism; wherein the supporting bracket of the first cable management mechanism is adjacent to and below the first connecting device of the first cable management mechanism such that, with the fastener of the second supporting mechanism mounted to the supporting bracket of the first cable management mechanism, the second cable management mechanism lies below the first cable management mechanism; and wherein the supporting bracket of the second cable management mechanism is adjacent to and above the first connecting device of the second cable management mechanism such that, with the fastener of the first supporting mechanism mounted to the supporting bracket of the second cable management mechanism, the first cable management mechanism lies above the second cable management mechanism.

2. The cable management arm of claim 1, wherein the supporting bracket of the first cable management mechanism includes a positioning hole and a positioning member elastically connected to the supporting bracket of the first cable management mechanism and having a blocking portion corresponding to the positioning hole, and the supporting bracket of the second cable management mechanism includes a positioning hole and a positioning member elastically connected to the supporting bracket of the second cable management mechanism and having a blocking portion corresponding to the positioning hole; and wherein the fastener of the first supporting mechanism is mounted to the positioning hole of the supporting bracket of the second cable management mechanism and is blocked by the blocking portion of the positioning member of the second cable management mechanism, and the fastener of the second supporting mechanism is mounted to the positioning hole of the supporting bracket of the first cable management mechanism and is blocked by the blocking portion of the positioning member of the first cable management mechanism.

3. The cable management arm of claim 1, wherein each of the first cable management mechanism and the second cable management mechanism further includes a slider, the slider of the first cable management mechanism is pivotally connected to the first arm member of the first cable management mechanism and is movably connected to the first supporting rail of the first supporting mechanism, and the slider of the second cable management mechanism is pivotally connected to the first arm member of the second cable management mechanism and is movably connected to the first supporting rail of the second supporting mechanism.

4. The cable management arm of claim 3, wherein each of the first supporting rail of the first supporting mechanism and the first supporting rail of the second supporting mechanism includes a first portion with a position-limiting element and a second portion with a position-limiting element so that, when displaced along the first supporting rail of the first supporting mechanism and the first supporting rail of the second supporting mechanism respectively, the slider of the first cable management mechanism and the slider of the second cable management mechanism are each limited between a corresponding said first portion and a corresponding said second portion by corresponding said position-limiting elements.

5. The cable management arm of claim 1, wherein the fastener of the first supporting mechanism is connected to the second supporting rail of the first supporting mechanism at a position adjacent to an end portion of the second supporting rail of the first supporting mechanism.

6. The cable management arm of claim 1, wherein the fastener of the second supporting mechanism is connected to the second supporting rail of the second supporting mechanism at a position adjacent to an end portion of the second supporting rail of the second supporting mechanism.

7. A cable management arm applicable to a chassis, the chassis including an upper-tier area and a lower-tier area, the chassis having two opposite lateral sides mounted to a rack via a first slide rail assembly and a second slide rail assembly respectively, each said slide rail assembly including a fixed rail and a movable rail longitudinally displaceable with respect to the fixed rail, the two opposite lateral sides of the chassis being mounted to the movable rails of the slide rail assemblies respectively, the cable management arm comprising:

a first cable management mechanism including: a first arm member; a second arm member movably connected to the first arm member, wherein the first arm member and the second arm member of the first cable management mechanism generally correspond in position to the upper-tier area of the chassis; a first connecting device movably connected to the first arm member, the first connecting device including a first connecting section, a second connecting section, and a passage at the first connecting section, the first connecting device being releasably mounted to the fixed rail of the first slide rail assembly; a supporting bracket connected to the second connecting section; and a second connecting device movably connected to the second arm member, the second connecting device being releasably mounted to the chassis;

a first supporting mechanism including: a first supporting rail for supporting one of the first arm member and the second arm member of the first cable management mechanism; a second supporting rail telescopically connected to the first supporting rail; a movable member connected to the first supporting rail, the movable member being movably mounted to the passage of the first connecting device of the first cable management mechanism; and a fastener connected to the second supporting rail;

a second cable management mechanism including: a first arm member; a second arm member movably connected to the first arm member, wherein the first arm member and the second arm member of the second cable management mechanism generally correspond in position to the lower-tier area of the chassis; a first connecting device movably connected to the first arm member, the first connecting device including an extension and being releasably mounted to the fixed rail of the second slide rail assembly; a supporting bracket connected to the extension, the supporting bracket being releasably connected to the fastener of the first supporting mechanism; and a second connecting device movably connected to the second arm member, the second connecting device being releasably mounted to the chassis; and a second supporting mechanism including: a first supporting rail for supporting one of the first arm member and the second arm member of the second cable management mechanism; a second supporting rail telescopically connected to the first supporting rail; a movable member connected to the first supporting rail, the movable member being movably mounted to the first connecting device of the second cable management mechanism; and a fastener connected to the second supporting rail, the fastener being releasably mounted to the supporting bracket of the first cable management mechanism.

8. The cable management arm of claim 7, wherein the supporting bracket of the first cable management mechanism is adjacent to and below the first connecting device of the first cable management mechanism such that, with the fastener of the second supporting mechanism mounted to the supporting bracket of the first cable management mechanism, the second cable management mechanism lies below the first cable management mechanism; and wherein the supporting bracket of the second cable management mechanism is adjacent to and above the first connecting device of the second cable management mechanism such that, with the fastener of the first supporting mechanism mounted to the supporting bracket of the second cable management mechanism, the first cable management mechanism lies above the second cable management mechanism.

9. The cable management arm of claim 7, wherein the two opposite lateral sides of the chassis are respectively connected with a first connecting base and a second connecting base, each said connecting base includes a stop portio, and each of the second connecting device of the first cable management mechanism and the second connecting device of the second cable management mechanism further includes an elastic portion, an engaging portion engageable with the stop portion of a corresponding said connecting base in response to an elastic force provided by the elastic portion, and a releasing portion for disengaging the engaging portion from the stop portion of the corresponding connecting base.

10. The cable management arm of claim 9, wherein each said connecting base further includes an insertion opening and a stop wall, and each of the second connecting device of the first cable management mechanism and the second connecting device of the second cable management mechanism further includes an inserting portion insertable into the insertion opening, and stoppable by the stop wall, of the corresponding connecting base.

11. The cable management arm of claim 7, wherein the fixed rail of each said slide rail assembly includes a connecting hole, and each of the first connecting device of the first cable management mechanism and the first connecting device of the second cable management mechanism further includes an elastic portion, an engaging portion engageable with the connecting hole of a corresponding said fixed rail in response to an elastic force provided by the elastic portion, and a releasing portion for disengaging the engaging portion from the connecting hole of the corresponding fixed rail.

12. The cable management arm of claim 11, wherein the fixed rail of each said slide rail assembly further includes a pair of fixing elements which define a channel, and each of the first connecting device of the first cable management mechanism and the first connecting device of the second cable management mechanism further includes an inserting portion insertable into the channel, and stoppable by the pair of fixing elements, of the corresponding fixed rail.

13. The cable management arm of claim 11, wherein each of the movable member of the first supporting mechanism and the movable member of the second supporting mechanism includes an operation portion; when the movable rails of the slide rail assemblies are retracted to a retracted position relative the fixed rails, the movable member of the first supporting mechanism and the movable member of the second supporting mechanism are displaced relative to the first connecting device of the first cable management mechanism and the first connecting device of the second cable management mechanism respectively and are thus retracted; and each of the engaging portion of the first connecting device of the first cable management mechanism and the engaging portion of the first connecting device of the second cable management mechanism is disengageable from the connecting hole of the corresponding fixed rail in response to a corresponding said operation portion being operated to drive a corresponding said releasing portion.

14. The cable management arm of claim 7, wherein the supporting bracket of the first cable management mechanism includes a positioning hole and a positioning member elastically connected to the supporting bracket of the first cable management mechanism and having a blocking portion corresponding to the positioning hole, and the supporting bracket of the second cable management mechanism includes a positioning hole and a positioning member elastically connected to the supporting bracket of the second cable management mechanism and having a blocking portion corresponding to the positioning hole; and wherein the fastener of the first supporting mechanism is mounted to the positioning hole of the supporting bracket of the second cable management mechanism and is blocked by the blocking portion of the positioning member of the second cable management mechanism, and the fastener of the second supporting mechanism is mounted to the positioning hole of the supporting bracket of the first cable management mechanism and is blocked by the blocking portion of the positioning member of the first cable management mechanism.

15. The cable management arm of claim 7, wherein each of the first cable management mechanism and the second cable management mechanism further includes a slider, the slider of the first cable management mechanism is pivotally connected to the first arm member of the first cable management mechanism and is movably connected to the first supporting rail of the first supporting mechanism, and the slider of the second cable management mechanism is pivotally connected to the first arm member of the second cable management mechanism and is movably connected to the first supporting rail of the second supporting mechanism.

16. The cable management arm of claim 15, wherein each of the first supporting rail of the first supporting mechanism and the first supporting rail of the second supporting mechanism includes a first portion with a position-limiting element and a second portion with a position-limiting element so that, when displaced along the first supporting rail of the first supporting mechanism and the first supporting rail of the second supporting mechanism respectively, the slider of the first cable management mechanism and the slider of the second cable management mechanism are each limited between a corresponding said first portion and a corresponding said second portion by corresponding said position-limiting elements.

17. The cable management arm of claim 7, wherein the fastener of the first supporting mechanism is connected to the second supporting rail of the first supporting mechanism at a position adjacent to an end portion of the second supporting rail of the first supporting mechanism.

18. The cable management arm of claim 7, wherein the fastener of the second supporting mechanism is connected to the second supporting rail of the second supporting mechanism at a position adjacent to an end portion of the second supporting rail of the second supporting mechanism.

* * * * *